United States Patent
Minakais et al.

(10) Patent No.: US 12,007,696 B2
(45) Date of Patent: Jun. 11, 2024

(54) BURST STATISTICS DATA AGGREGATION FILTER

(71) Applicant: Cymer, LLC, San Diego, CA (US)

(72) Inventors: Matthew Minakais, San Diego, CA (US); Russell Allen Burdt, San Diego, CA (US)

(73) Assignee: Cymer, LLC, San Diego, CA (US)

(*) Notice: Subject to any disclaimer, the term of this patent is extended or adjusted under 35 U.S.C. 154(b) by 0 days.

(21) Appl. No.: 17/779,290

(22) PCT Filed: Nov. 18, 2020

(86) PCT No.: PCT/US2020/061113
§ 371 (c)(1),
(2) Date: May 24, 2022

(87) PCT Pub. No.: WO2021/118777
PCT Pub. Date: Jun. 17, 2021

(65) Prior Publication Data
US 2022/0365445 A1 Nov. 17, 2022

Related U.S. Application Data
(60) Provisional application No. 62/946,889, filed on Dec. 11, 2019.

(51) Int. Cl.
*G03F 7/20* (2006.01)
*G03F 7/00* (2006.01)
*H01S 3/13* (2006.01)

(52) U.S. Cl.
CPC ...... *G03F 7/70508* (2013.01); *G03F 7/70025* (2013.01); *G03F 7/70041* (2013.01); *H01S 3/1305* (2013.01); *G03F 7/70033* (2013.01)

(58) Field of Classification Search
CPC ............ G03F 7/70508; G03F 7/70025; G03F 7/70041; G03F 7/70033; H01S 3/1305; H01S 3/10069; H01S 3/1306
See application file for complete search history.

(56) References Cited

U.S. PATENT DOCUMENTS

| | | |
|---|---|---|
| 2001/0020195 A1 | 9/2001 | Patel et al. |
| 2015/0168848 A1 | 6/2015 | Tanaka et al. |

(Continued)

FOREIGN PATENT DOCUMENTS

| | | |
|---|---|---|
| TW | 201935145 A | 9/2019 |
| WO | 2014030645 A1 | 2/2014 |

(Continued)

OTHER PUBLICATIONS

Jens Weckesser, European International Searching Authority of the European Patent Office, International Search Report and Written Opinion, corresponding PCT Application No. PCT/US2020/061113, dated Apr. 8, 2021, 10 pages total.

(Continued)

*Primary Examiner* — Mesfin T Asfaw
(74) *Attorney, Agent, or Firm* — DiBerardino McGovern IP Group LLC

(57) ABSTRACT

A system includes a laser source configured to generate one or more bursts of laser pulses and a data collection and analysis system. The data collection and analysis system is configured to receive, from the laser source, data associated with the one or more bursts of laser pulses and determine, based on the received data, that the one or more bursts of laser pulses are for external use. The data collection and analysis system is further configured to determine, based on the received data, whether the one or more bursts of laser pulses are for an on-wafer operation or are for a calibration operation.

25 Claims, 12 Drawing Sheets

(56) References Cited

U.S. PATENT DOCUMENTS

| | | |
|---|---|---|
| 2018/0017878 A1 | 1/2018 | Bibby, Jr. et al. |
| 2019/0280447 A1 | 9/2019 | Nelson |
| 2019/0384182 A1 | 12/2019 | Takarada et al. |
| 2020/0133249 A1 | 4/2020 | Igarashi et al. |

FOREIGN PATENT DOCUMENTS

| | | |
|---|---|---|
| WO | 2017090167 A1 | 6/2017 |
| WO | 2019043780 A1 | 3/2019 |

OTHER PUBLICATIONS

JPO, Office Action, counterpart Japanese Patent Application No. 2022-527855, dated Jun. 5, 2023, 9 pages total (including English translation of 5 pages).

BURST STATISTICS DATA AGGREGATION FILTER

CROSS REFERENCE TO RELATED APPLICATION

This application claims priority to U.S. Application No. 62/946,889 filed Dec. 11, 2019 and titled BURST STATISTICS DATA AGGREGATION FILTER, which is incorporated herein in its entirety by reference.

FIELD

The present disclosure relates to systems and methods for analyzing and using data associated with a laser source.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern that is formed on an individual layer of the IC being formed. This pattern can be transferred onto a target portion (e.g., comprising part of, one, or several dies) on a substrate (e.g., a silicon wafer). Transfer of the pattern is typically via imaging onto a layer of radiation-sensitive material (photoresist or, simply "resist") provided on the substrate. In general, a single substrate will contain a network of adjacent target portions that are successively patterned. Known lithographic apparatus includes so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the target portions parallel or anti-parallel to this scanning direction. It is also possible to transfer the pattern from the patterning device to the substrate by imprinting the pattern onto the substrate.

A laser source can be used with the lithographic apparatus for, for example, generating illumination radiation for illuminating the patterning device and exposing the substrate. The laser source and the lithographic apparatus can generate a large amount of data. Accordingly, there is a need for a system and a method to aggregate, cluster, and analyze the data associated with the laser source to understand and control the operation of the laser source and/or the lithographic apparatus.

SUMMARY

Embodiments of systems and methods for aggregating and analyzing the data associated with a laser source are described in the present disclosure.

One aspect of the present disclosure provides a system that includes a laser source configured to generate one or more bursts of laser pulses and a data collection and analysis system. The data collection and analysis system is configured to receive, from the laser source, data associated with the one or more bursts of laser pulses and determine, based on the received data, that the one or more bursts of laser pulses are for external use. The data collection and analysis system is further configured to determine, based on the received data, whether the one or more bursts of laser pulses are for an on-wafer operation or are for a calibration operation.

In some embodiments, the data collection and analysis system is configured to determine, from the received data, an energy control mode (ECM) value associated with the one or more bursts of laser pulses and compare the determined ECM value with a first ECM value. In response to the determine ECM value being different from the first ECM value, the data collection and analysis system is configured to determine that the one or more bursts of laser pulses are for external use.

In some embodiments, the data collection and analysis system is further configured to determine a number of bursts in the one or more bursts of laser pulses. In response to determining that the one or more bursts of laser pulses comprises one burst, the data collection and analysis system is configured to determine that the one burst of laser pulses is for the calibration operation.

In some embodiments, the data collection and analysis system is further configured to apply a calibration category test to the received data in response to determining that the one or more bursts of laser pulses comprise more than one burst rather than containing exactly one burst.

In some embodiments, in response to the calibration category test being satisfied, the data collection and analysis system is further configured to determine that a last burst of the one or more bursts is for the calibration operation and determine that other bursts in the one or more bursts are for the on-wafer operation.

In some embodiments, in response to the calibration category test not being satisfied, the data collection and analysis system is further configured to determine that the one or more bursts are for the on-wafer operation.

In some embodiments, the data collection and analysis system is further configured to exclude, from the received data, data associated with a first burst and a last burst of the one or more bursts to generate a first modified data. The data collection and analysis system is further configured to exclude, from the first modified data, data associated with a burst with maximum inter burst interval (IBI) value to generate a second modified data. The data collection and analysis system is further configured to generate a mean IBI value based on IBI values in the second modified data, generate a standard deviation value based on the IBI values in the second modified data, and generate an IBI threshold based on the mean IBI value, the standard deviation value, and an IBI parameter.

In some embodiments, the data collection and analysis system is further configured to determine that the calibration category test is satisfied in response to an IBI value associated with the last burst being greater than the IB threshold and, a pulse per burst (PPB) associated with the last burst being greater than a PBB threshold or a high voltage command variance (HVV) associated with the last burst being greater than a HVV threshold. In response to the determining that the calibration category test is satisfied, the data collection and analysis system is further configured to determine that a last burst of the one or more bursts is for the calibration operation and determine that other bursts in the one or more bursts are for the on-wafer operation.

In some embodiments, the data collection and analysis system is further configured to determine a first part of the one or more bursts are for the calibration operation and determine a second part of the one or more bursts are for the on-wafer operation. The data collection and analysis system is further configured to use data, from the received data, associated with the second part of the one or more bursts to determine one or more metrics for the second part of the one or more bursts.

In some embodiments, the one or more bursts include a calibration burst used for the calibration operation and one or more on-wafer bursts used for the on-wafer operation. The calibration burst includes a characteristic that differentiates the calibration burst from the one or more on-wafer bursts. The data collection and analysis system is configured to use the characteristic of the calibration burst to distinguish the calibration burst from the on-wafer burst.

In some embodiments, the data collection and analysis system is further configured to assign a wafer identifier to the calibration burst.

In some embodiments, the one or more bursts include a first calibration burst used for the calibration operation, a second calibration burst used for a second calibration operation, and one or more on-wafer bursts used for the on-wafer operation. The first calibration burst includes a first characteristic that differentiates the first calibration burst from the one or more on-wafer bursts and the second calibration burst includes a second characteristic that differentiates the second calibration burst from the one or more on-wafer bursts. The data collection and analysis system is configured to use the first characteristic of the first calibration burst and the second characteristic of the second calibration burst to distinguish the first and second calibration bursts from the one or more on-wafer bursts.

Another aspect of the present disclosure provides a method including receiving, at a data collection and analysis system and from a laser source, data associated with one or more bursts of laser pulses generated by the laser source. The method further includes determining, by the data collection and analysis system and based on the received data, that the one or more bursts of laser pulses are for external use. The method also includes determining, by the data collection and analysis system based on the received data, whether the one or more bursts of laser pulses are for an on-wafer operation or are for a calibration operation.

Another aspect of the present disclosure provides a lithographic apparatus that includes an illumination system configured to condition a radiation beam and a projection system configured to project a pattern imparted to the radiation beam onto a substrate. The illumination system includes a laser source configured to generate one or more bursts of laser pulses and a data collection and analysis system. The data collection and analysis system is configured to receive, from the laser source, data associated with the one or more bursts of laser pulses and determine, based on the received data, that the one or more bursts of laser pulses are for external use. The data collection and analysis system is further configured to determine, based on the received data, whether the one or more bursts of laser pulses are for an on-wafer operation or are for a calibration operation.

Another aspect of the present disclosure provides a non-transitory computer-readable medium storing instructions that, when executed by a processor, cause the processor to perform operations. The operations include receiving, from a laser source, data associated with one or more bursts of laser pulses generated by the laser source, determining, based on the received data, that the one or more bursts of laser pulses are for external use, and determining, based on the received data, whether the one or more bursts of laser pulses are for an on-wafer operation or are for a calibration operation.

Further features, as well as the structure and operation of various embodiments, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the embodiments of this disclosure and to enable a person skilled in the relevant art(s) to make and use the embodiments of this disclosure.

Figure 1A:
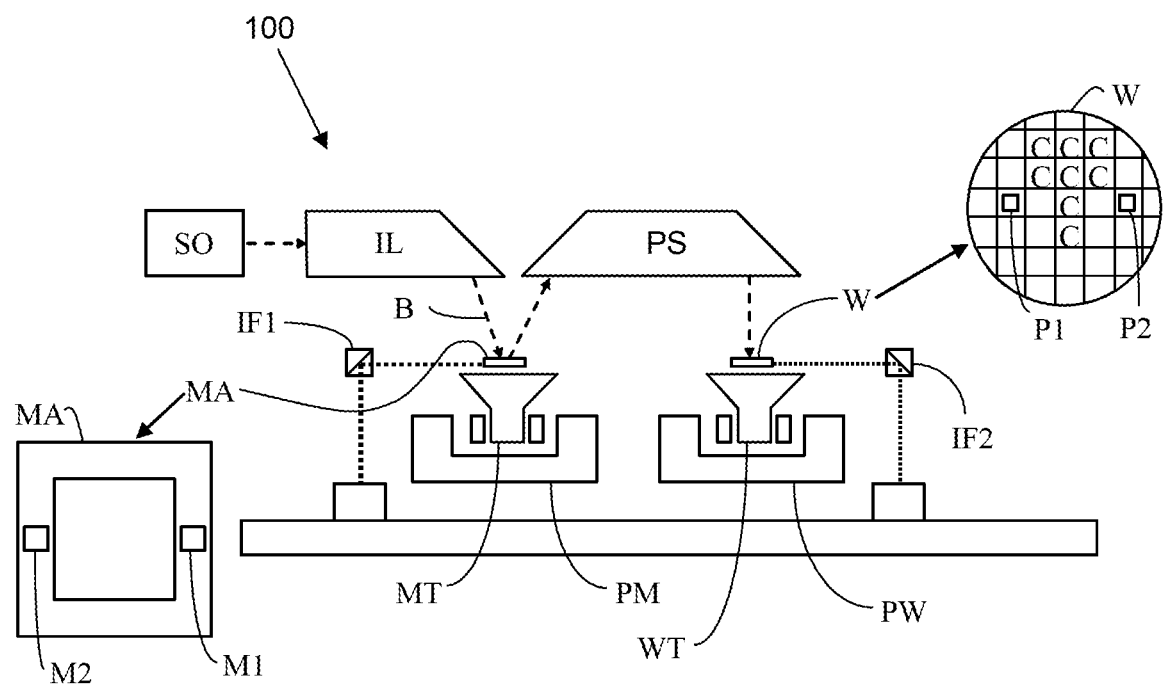
FIG. 1A is a schematic illustration of a reflective lithographic apparatus, according to an embodiment.

The features the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," "one exemplary embodiment," "an exemplary embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
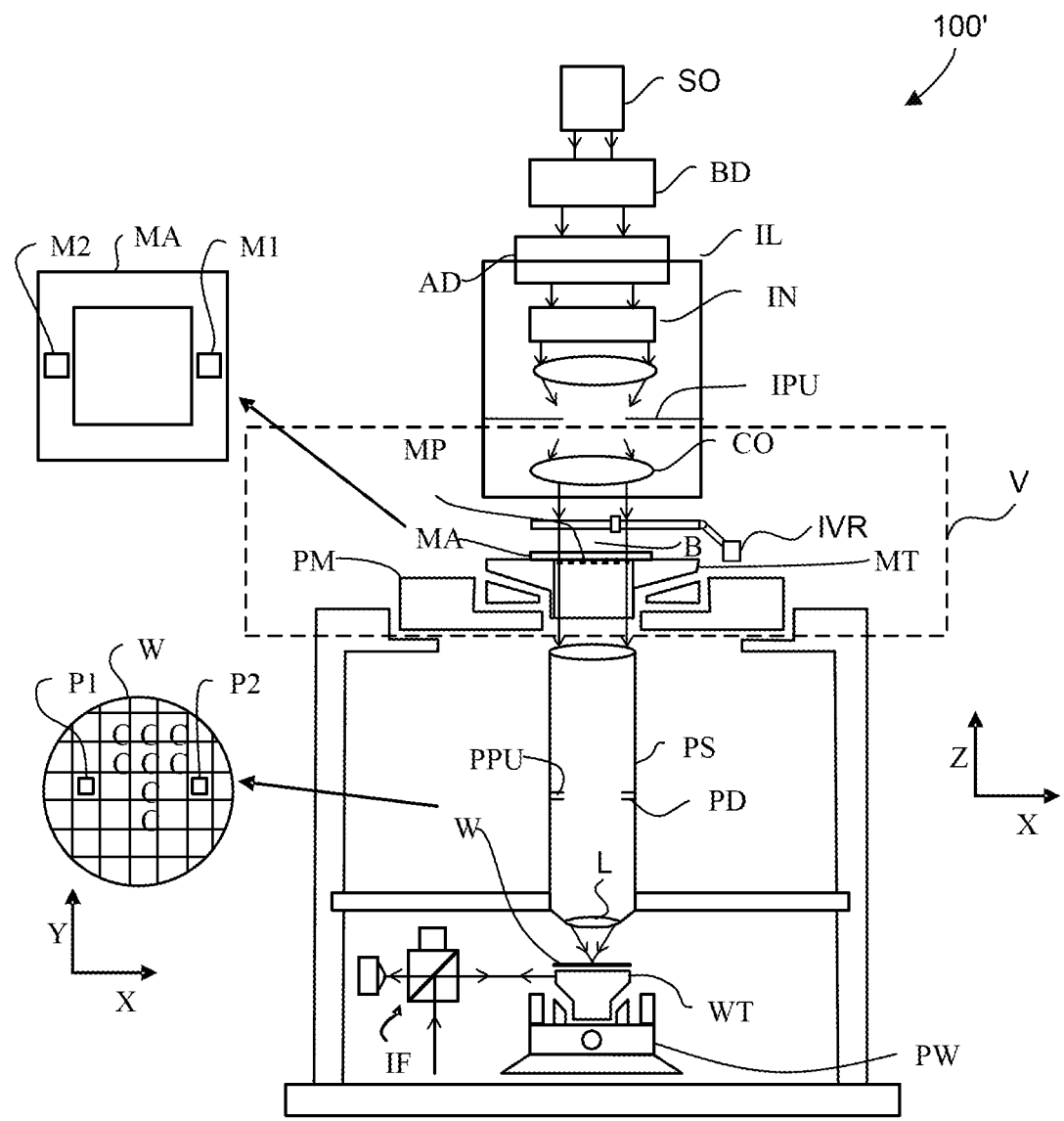
FIG. 1B is a schematic illustration of a transmissive lithographic apparatus, according to an embodiment.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet (DUV) radiation or extreme ultra violet (EUV) radiation); a support structure (for example, a mask table) MT configured to support a patterning device (for example, a mask, a reticle, or a dynamic patterning device) MA and connected to a first positioner PM configured to accurately position the patterning device MA; and, a substrate holder such as a table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for extreme ultraviolet (EUV) or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system PS has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
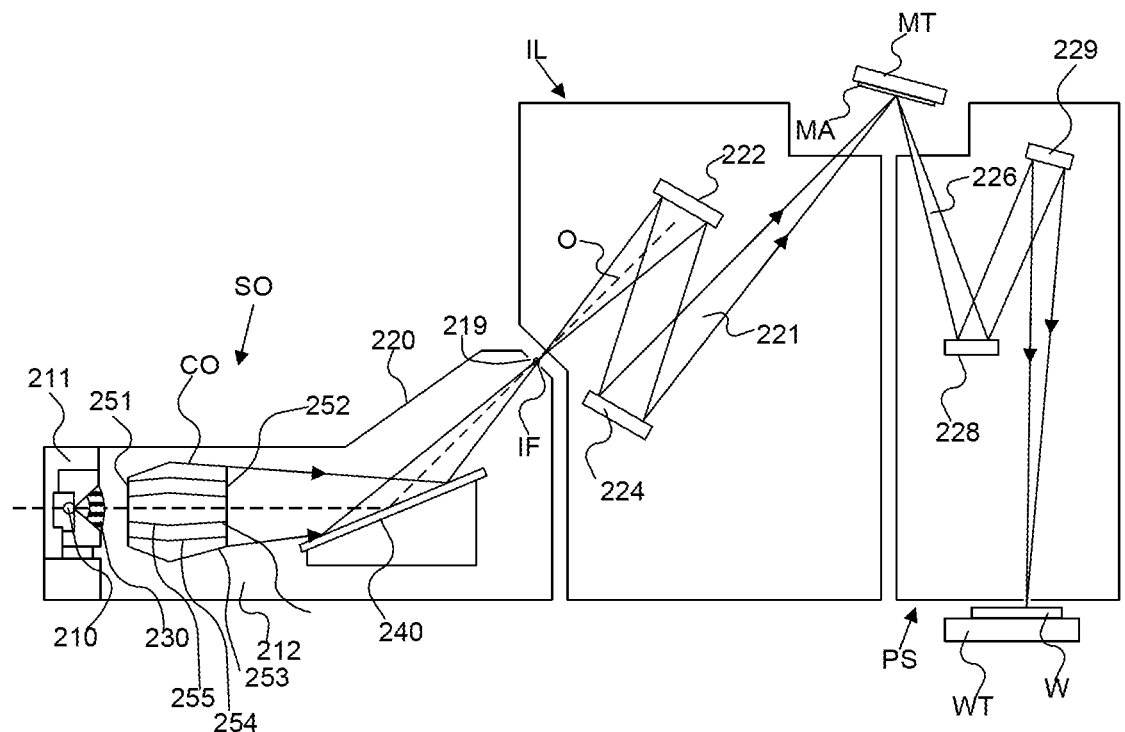
FIG. 2 is a more detailed schematic illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220. The source collector apparatus SO includes a source chamber 211 and a collector chamber 212 and is configured to produce and transmit EUV radiation. EUV radiation may be produced by a gas or vapor, for example Xe gas, Li vapor, or Sn vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the EUV radiation emitting plasma 210 is passed from the source chamber 211 into the collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
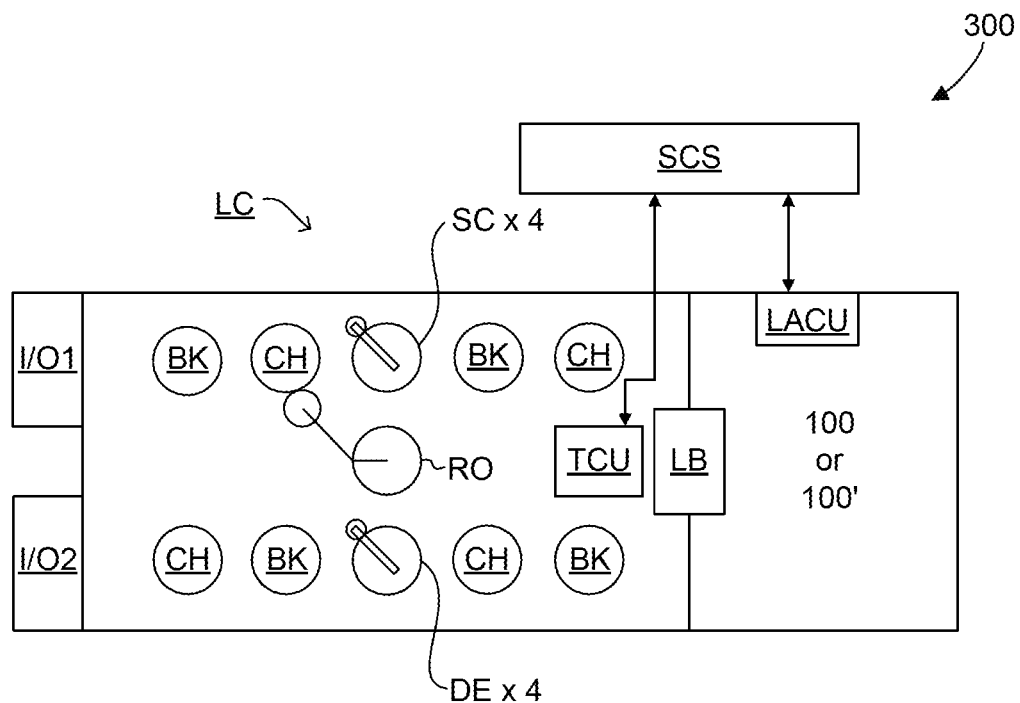
FIG. 3 is a schematic illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and stations, and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Data Collection and Analysis System

Figure 4A:
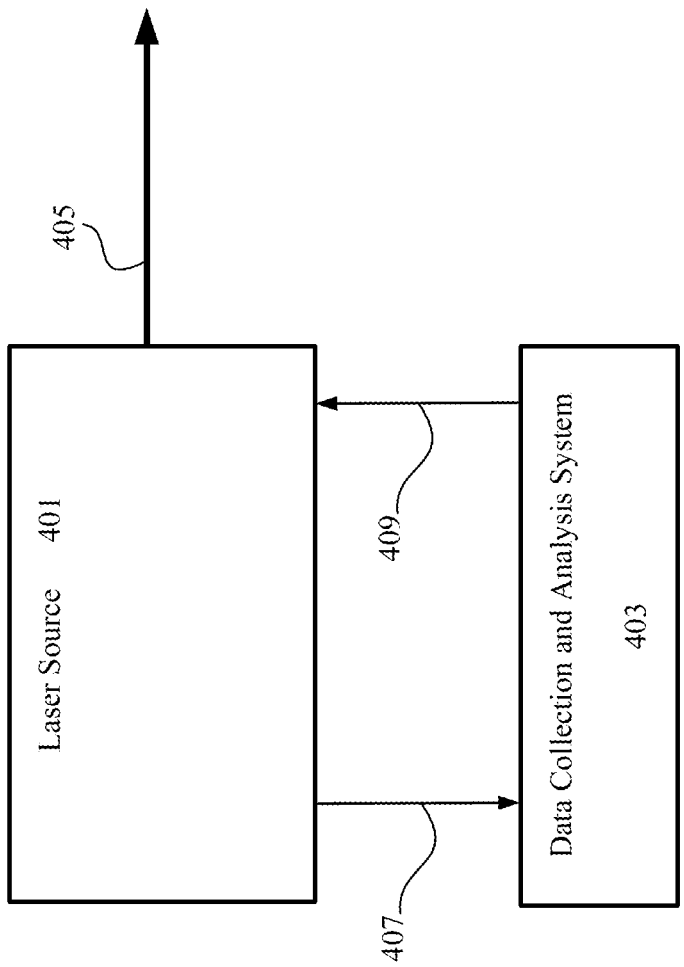
FIG. 4A illustrates a schematic of a laser source with a data collection and analysis system, according to some embodiments of the present disclosure.

FIG. 4A illustrates a schematic of a laser source 401 with a data collection and analysis system 403, according to some embodiments of the present disclosure. In some embodiments, laser source 401 can be used as part of, or in addition to, source SO of lithographic apparatus 100 or 100'. In some embodiments, laser source 401 can be used as part of, or in addition to, source SO of lithographic apparatus of FIG. 2. Additionally, or alternatively, laser source 401 can be used in generating DUV radiation to be used in lithographic apparatus 100 or 100' or other DUV lithographic apparatuses. As illustrated in FIG. 4A, laser source 401 can generate laser 405, which is used in the lithographic apparatus. In some embodiments in which laser source 401 is used as part of, or in addition to, source SO of lithographic apparatus of FIG. 2, laser source 401 generates laser 405 which can be used to convert a target material into a plasma that generates EUV radiation that is directed to and used in a lithographic apparatus.

According to some embodiments, laser source 401 can include and/or can be communicatively coupled to data collection and analysis system 403. Data collection and analysis system 403 is configured to receive data 407 from laser source 401. Additionally, or alternatively, data collection and analysis system 403 can send data and/or control information 409 back to laser source 401.

According to some embodiments, data 407 from laser source 401 can include raw burst data associated with laser source 401. The raw burst data is data received by data collection and analysis system 403 from laser source 401 and represents aggregated pulse-by-pulse data (e.g., streaming data) associated with laser source 401 that exists on laser source 401. In other words, according to some embodiments, the pulse-by-pulse data that exists on laser source 401 can be considered as the streaming data. According to some embodiments, the streaming data associated with laser source 401 is pulse-level data and can include information about energy control mode, energy level, wavelength, etc. associated with each pulse. This information is provided as example information and the streaming data associated with laser source 401 can include other data associated with the laser pulses. In some examples, the streaming data can include one row of data per pulse and each column of this one row includes parameters associated with the pulse. However, the streaming data can include other collection of data associated with the laser pulse.

According to some embodiments, data collection and analysis system 403 is configured to receive data 407 (e.g., raw burst data). In some examples, the raw burst data is burst-level data and is an aggregation of the streaming data for a plurality of laser pulses in a burst. For example, the raw burst data can include aggregation data such as, but not limited to, maximum value, minimum value, sliding window average, number of pulses per burst (PPB), high voltage command variance (HVV), etc. of the streaming data associated with the plurality of laser pulses in the burst. In some examples, the raw burst data can include one row of data per burst pulse and each column of this one row includes parameters associated with the burst. However, the raw burst data can include other collection of data associated with the burst.

According to some embodiments, data collection and analysis system 403 is configured to analyze the received data 407. This analysis can include, but is not limited to, clustering data into different groups, generating one or more data subsets, determining one or more metrics (e.g., performance measures) based on data 407 and/or the data subsets, etc. These operations are provided as exemplary operation(s) of data collection and analysis system 403. Data collection and analysis system 403 can be configured to perform additional or other operations on data 407.

For example, data collection and analysis system 403 can be configured to generate burst data from the received data 407. In some examples, the burst data can include one row per burst and can be a subset of raw burst data (e.g., data 407). However, the burst data can include other collection of data associated with the raw burst data. In another example, data collection and analysis system 403 can be configured to determine burst stat data. For example, collection and analysis system 403 can generate burst stat data from the burst data. In some examples, the burst stat data can include one or more metrics (e.g., performance metrics) associated with the burst data. The metric can include, but is not limited to, minimum value, maximum value, mean value, standard deviation value, and/or other metrics. In one example, burst stat data can include one row per a substrate (e.g., a wafer) and/or one row per energy control mode (ECM).

According to some embodiments, data collection and analysis system 403 is configured to categorize data 407 (or a subset of data 407) into two or more categories. As discussed above, data 407 can include raw burst data associated with one or more bursts of laser pulses generated by laser source 401. In some examples, data collection and analysis system 403 is configured to categorize raw burst data into the two or more categories. Additionally, or alternatively, data collection and analysis system 403 is configured to categorize burst data (e.g., a subset of raw burst data) into the two or more categories. Some of the embodiments of this disclosure are discussed with respect to categorizing data 407. However, as noted above, the categorization can be on data 407 (e.g., raw burst data) and/or a subset of data 407 (e.g., burst data).

According to some embodiments, a first step in categorizing data 407 can include categorizing data 407 based on the energy control mode (ECM) associated with data 407. Data 407 associated with one or more bursts can indicate whether each burst is generated for external use (e.g., to be used with the lithographic apparatus—for example, to be used to illuminate/expose a substrate (e.g., a wafer) in the lithographic apparatus) or the burst is generated for internal use (e.g., for internal use in laser source 401 and not for exposure of the substrate). In other words, when the ECM indicate the internal use, the lithographic apparatus (e.g., the scanner of the lithographic apparatus) is not controlling the energy of the laser pulses in laser source 401 but laser source 401 is controlling the energy of the laser pulses. As a non-limiting example, data 407 can include an ECM value. The ECM value indicates whether the burst is generated for external use or internal use.

Data collection and analysis system 403 is configured to determine the ECM value of data 407, and use the ECM value to categorize data 407. For example, data collection and analysis system 403 can aggregate blocks of consecutive bursts with the same ECM value. After categorizing and aggregating data 407 into external use category or internal use category, data collection and analysis system 403 can determine one or more metrics for each block of aggregated bursts (e.g., determine burst stat data.) According to some embodiments, data collection and analysis system 403 is configured to determine one or more metrics for the block of aggregated bursts in the external use category and/or one or more metrics for the block of aggregated bursts in the internal use category (e.g., determine burst stat data.)

Figure 4B:
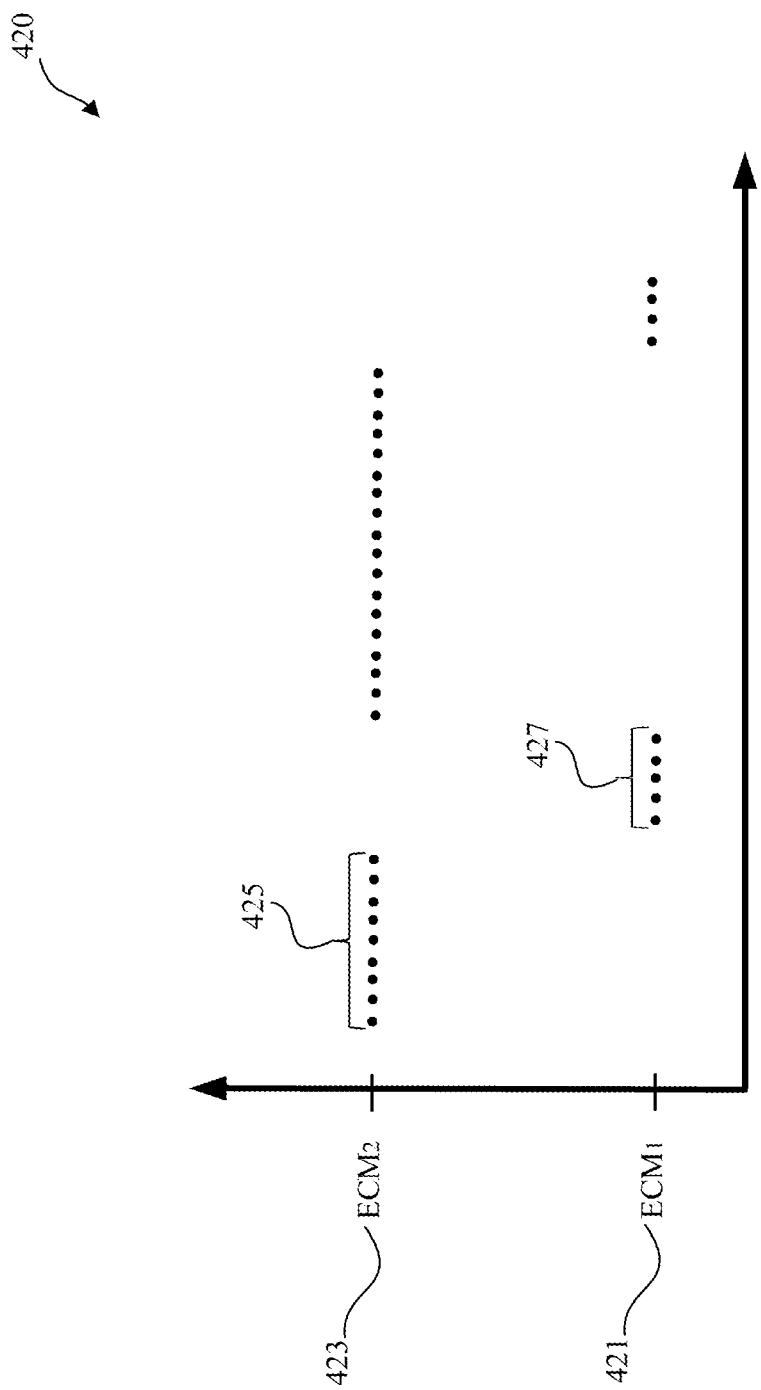
FIGS. 4B-4D illustrate exemplary graphs depicting exemplary categorizations, according to some embodiments of this disclosure.

FIG. 4B illustrates an exemplary graph 420 depicting an exemplary categorization, according to some embodiments of this disclosure. As illustrated in FIG. 4B, in one example, data collection and analysis system 403 can use two values of ECM (ECM1 421 and ECM2 423) for categorizing data 407. In this example, graph 420 illustrates external use block 425 associated with ECM value of ECM2 423 indicating data categorized in external use category. In this example, graph 420 also illustrates internal use block 427 associated with ECM value of ECM1 421 indicating data categorized in internal use category. It is noted that although two ECM values are discussed in some embodiments of this disclosure, other numbers of ECM values can be used by data collection and analysis system 403 to categorize data 407.

According to some embodiments, when a burst of laser pulses (e.g., part of laser 405) is generated for external use (e.g., with an ECM value in data 407 indicating external use), the burst can be used for on-wafer operation or for one or more calibration operations. The on-wafer operation can include exposure operation—e.g., an operation for illuminating a patterning device in a lithographic apparatus and imparting a radiation beam with a pattern such as to create a pattern in a target portion of a substrate (e.g., a wafer). The one or more calibration operations can include any operation to calibrate laser source 401 and/or the lithographic apparatus. For example, the one or more calibration operations can include calibrating the laser gain before on-wafer operation. In some examples, the one or more calibration operation can include sinusoidal calibration (e.g., calibration using a sine wave). As another example, the one or more calibration operations can include calibration using/based on laser's wavelength(s) and/or bandwidth(s). However, the embodiments of this disclosure can include other calibration operations.

According to some embodiments, when the burst of laser pulses is used for the one or more calibration operations, the burst is used with an ECM value indicating the external use. As discussed in more detail below, data collection and analysis system 403 is configured to distinguish between burst(s) used for on-wafer operation and burst(s) used for one or more calibration operations. Therefore, data collection and analysis system 403 is configured to further categorize data in the external use category to on-wafer operation category and calibration operation category. In other words, data collection and analysis system 403 is configured to categorize data 407 into at least three categories—(1) internal use category, (2) on-wafer operation category, and (3) calibration operation category.

In some embodiments, the "on-wafer" category refers to a laser burst operation that indirectly and ultimately involves an exposure operation on a wafer. For example, the burst of laser pulses may excite a target material to convert a solid target material into a plasma that creates EUV radiation. The EUV radiation is directed to a patterning device in a lithographic apparatus where the EUV radiation is patterned such as to create a pattern in a target portion of a substrate (e.g., a wafer.)

After categorizing and aggregating data 407 into these at least three categories, data collection and analysis system 403 can determine one or more metrics (e.g., performance measures) for each block of aggregated bursts (e.g., determine burst stat data.) According to some embodiments, data collection and analysis system 403 is configured to determine one or more metrics for the block of aggregated bursts in the internal use category, one or more metrics for the block of aggregated bursts in the calibration operation category, and/or one or more metrics for the block of aggregated bursts in the on-wafer operation category (e.g., determine burst stat data.) In some examples, burst stat data can include at least three rows per a substrate (e.g., a wafer). In this example, one row of the burst stat data is associated with the internal use category, another row of the burst stat data is associated with the on-wafer operation category, and one or more other rows of the burst stat data are associated with one more calibration operations. In some examples, each ECM-mode block can have a maximum of two rows. For example, ECM blocks associated with internal use category can have one row. Alternatively, ECM blocks associated with external use category can have one row when there is no burst in calibration operation category, can have one row when there is a single burst in the block, or two rows when there are on-wafer burst(s) and burst(s) in calibration operation category. In some examples, the burst stat data can be the output of calibration filter 503 of FIG. 5 and/or the output of metric generator 505 of FIG. 5.

According to some embodiments, by distinguishing between on-wafer operation category and calibration operation category, data collection and analysis system 403 is able to generate the one or more metrics for the block of aggregated burst in the on-wafer operation category. Therefore, data collection and analysis system 403 is able to generate the one or more metrics that better and more accurately represent the block of aggregated bursts in the on-wafer operation category by filtering out data associated with the calibration operation category. In other words, data collection and analysis system 403 is able to generate performance metric(s) that more accurately represent exposure data and can be further used by data collection and analysis system 403 in monitoring and controlling laser source 401.

Although some embodiments of this disclosure are discussed with respect to at least three categories, this disclosure is not limited to these categories. In some embodiments, the calibration operation category can be further divided into two or more sub-categories and data collection and analysis system 403 can be configured to analyze and aggregate data 407 in two or more sub-categories of the calibration operation category. For example, each one of the two or more sub-categories in the calibration operation category can be associated with one calibration operation. According to some embodiments, data collection and analysis system 403 can be configured to aggregate data 407 in a sub-category associated with a corresponding calibration operation based on one or more parameters associated with that calibration operation. Using the one or more parameters associated with each calibration operation, data collection and analysis system 403 can aggregate data 407 into its associated calibration operation sub-category.

According to some embodiments, after analyzing, categorizing, aggregating, and/or generating one or more metrics for data associated with on-wafer operation category, data collection and analysis system 403 can be configured to use the one or more metrics for further monitoring and controlling (e.g., data and/or control information 409) of laser source 401. In other words, data collection and analysis system 403 is able to generate and use (e.g., by monitoring and controlling laser source 401) performance metric(s) that more accurately represent exposure data.

In some examples, data collection and analysis system 403 can be located locally with laser source 401. Additionally, or alternatively, data collection and analysis system 403 can be located at a central location receiving data from one or more laser sources. In some examples, data collection and analysis system 403 can include components that are located locally with lasers source 401 and/or are distributed at different geographic places and communicate with each other using one or more networks.

Figure 4C:
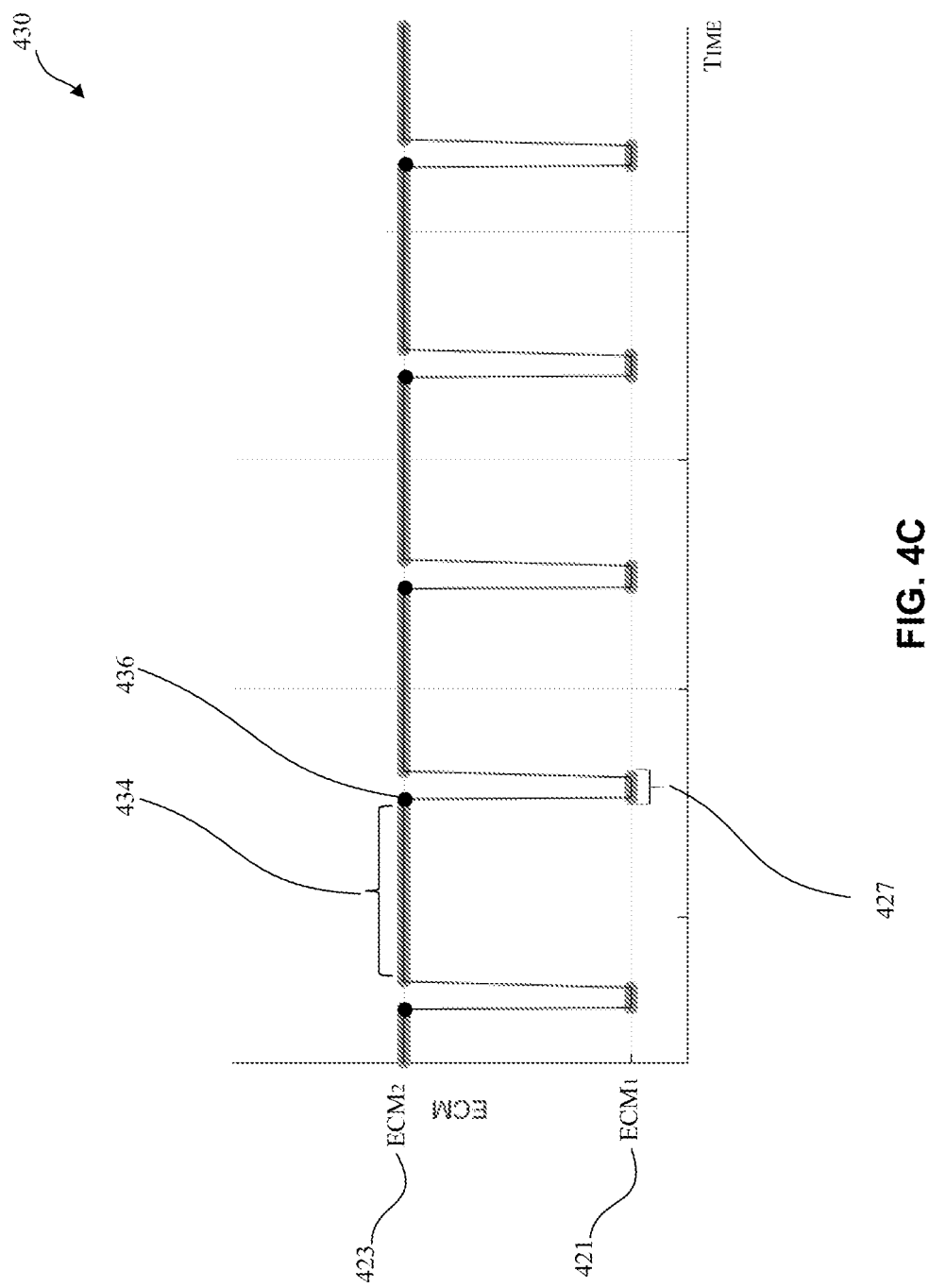

FIG. 4C illustrates an exemplary graph 430 depicting another exemplary categorization, according to some embodiments of this disclosure. As illustrated in FIG. 4C, in one example, data collection and analysis system 403 can use two values of ECM (ECM1 421 and ECM2 423) for categorizing data 407. In this example, graph 430 illustrates block 434 of one or more bursts associated with ECM value of ECM2 423 indicating data categorized in on-wafer operation category. In this example, graph 430 also illustrates internal block 427 of one or more bursts associated with ECM value of ECM1 421 indicating data categorized in internal use category. In this example, graph 430 further illustrates burst 436 associated with ECM value of ECM2 423 indicating data categorized in calibration operation category.

In some examples, the burst categorized in calibration operation category can be the last bust of the block associated with ECM value of ECM2 423. In other words, in example of FIG. 4C, burst 436 is the last burst after block 434 of one or more bursts. However, the embodiments of this disclosure are not limited to this example, and burst(s) in on-wafer operation category and burst(s) in calibration category can have other numbers and relations.

Figure 4D:
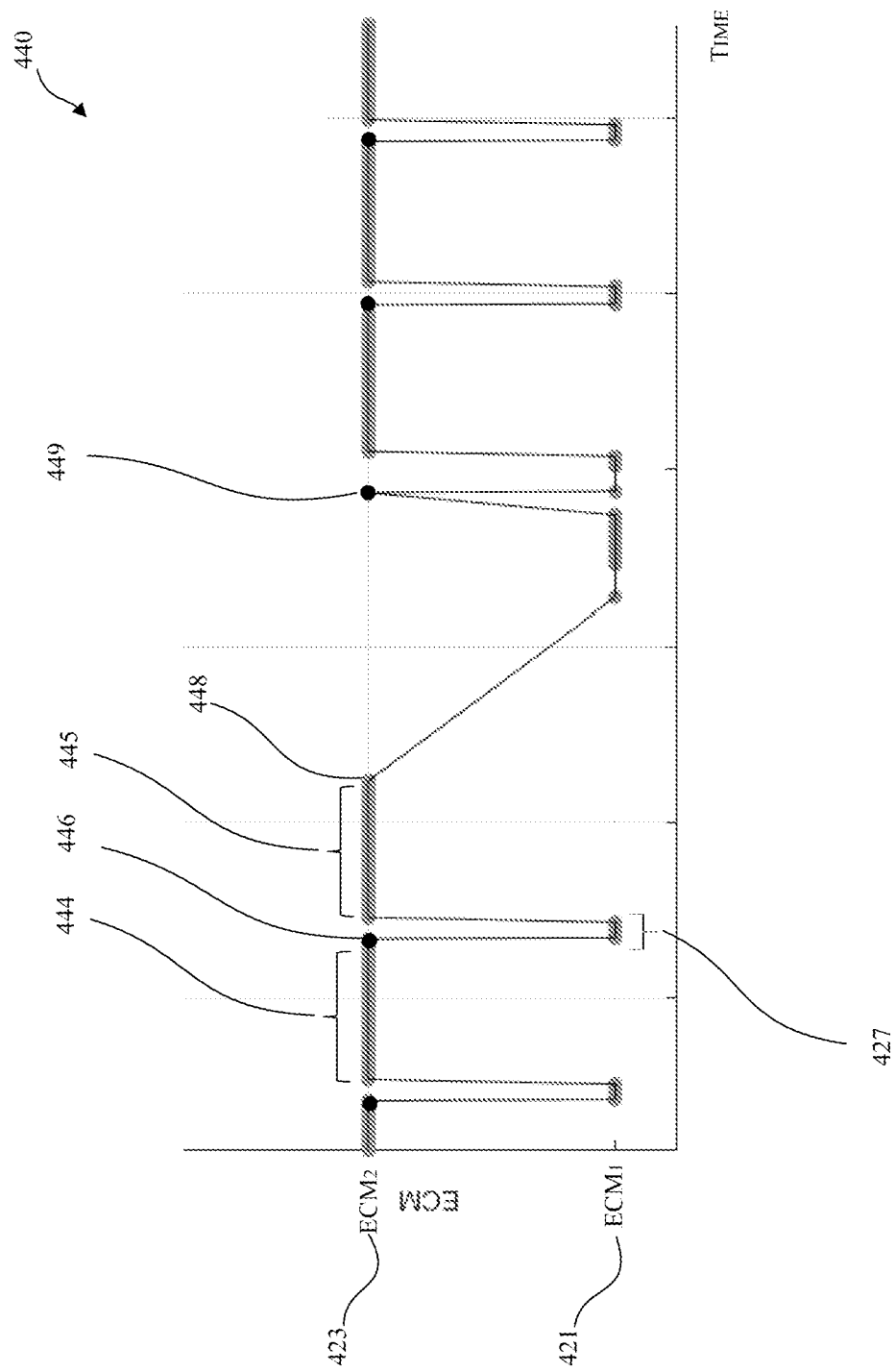

FIG. 4D illustrates an exemplary graph 440 depicting another exemplary categorization, according to some embodiments of this disclosure. As illustrated in FIG. 4D, in one example, data collection and analysis system 403 can use two values of ECM (ECM1 421 and ECM2 423) for categorizing data 407. In this example, graph 440 illustrates block 444 of one or more bursts associated with ECM value of ECM2 423 indicating data categorized in on-wafer operation category. In this example, graph 440 also illustrates internal block 427 of one or more bursts associated with ECM value of ECM1 421 indicating data categorized in internal use category. In this example, graph 440 further illustrates burst 446 associated with ECM value of ECM2 423 indicating data categorized in calibration operation category.

In some examples, the burst categorized in calibration operation category can be the last bust of the block associated with ECM value of ECM2 423. In other words, in example of FIG. 4D, burst 446 is the last burst after block 444. However, the embodiments of this disclosure are not limited to this example, and burst(s) in on-wafer operation category and burst(s) in calibration category can have other numbers and relations. For example, in the example of FIG. 4D, burst 448 is not a calibration burst and both block 445 one or more bursts and burst 448 can be categorized in on-wafer operation category. In this example, burst 449 can be a calibration burst.

Figure 5:
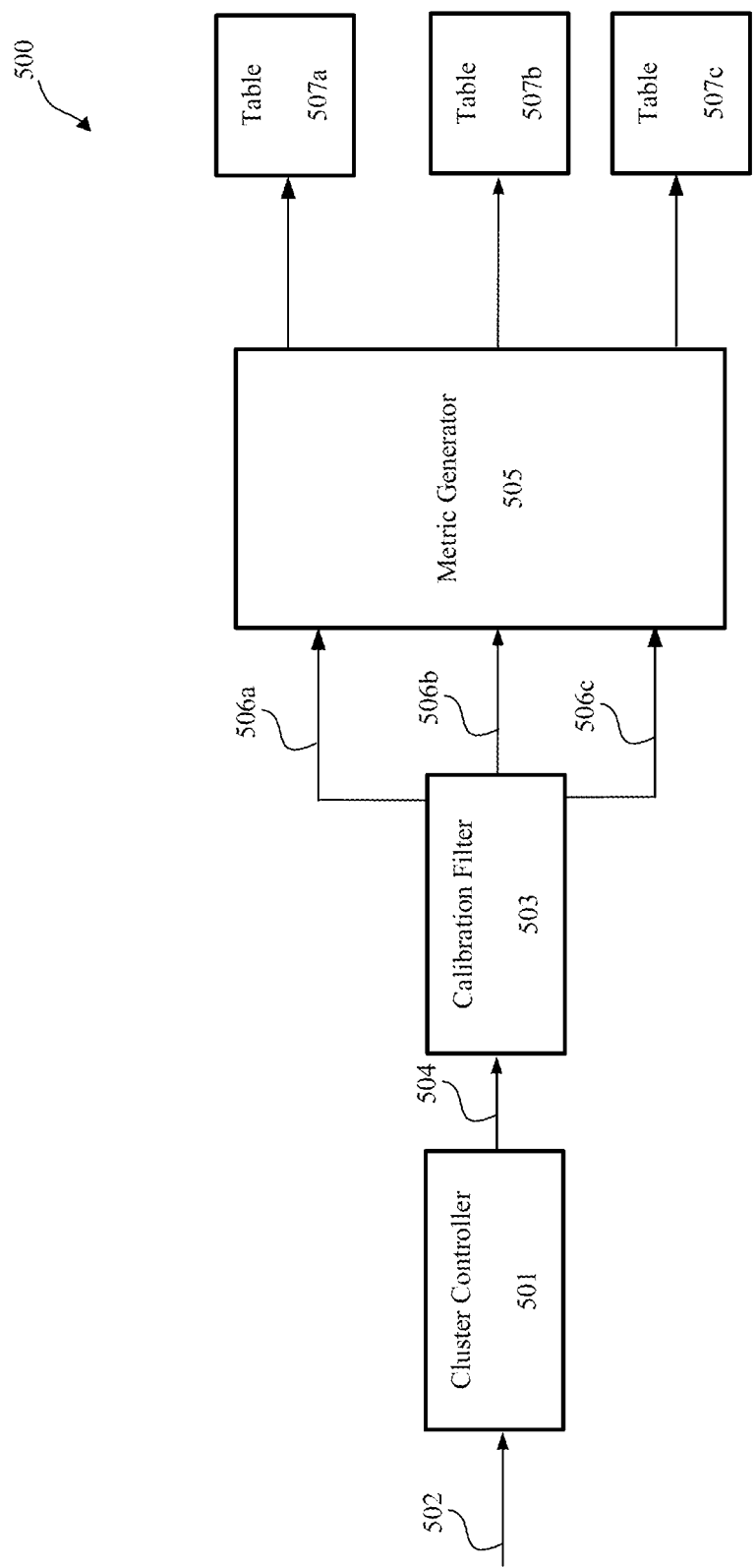
FIG. 5 illustrates an exemplary functional block diagram depicting an example system implementing the data collection and analysis system, according to some embodiments of this disclosure.

FIG. 5 is a functional block diagram depicting an example system implementing data collection and analysis system 403, according to some embodiments of this disclosure. System 500 of FIG. 5 can be and/or can be implemented within data collection and analysis system 403.

System 500 includes a cluster controller 501, a calibration filter 503, a metric generator 505, and tables 507a-507c. It is noted that the components are depicted as exemplary components of the system 500, and the system 500 can include fewer, more, or other components.

According to some embodiments, cluster controller 501 is configured to receive burst data 502. In some examples, burst data 502 is generated based on data 407 (e.g., raw burst data) that arrives from laser source 401 at data collection and analysis system 403, as illustrated in FIG. 4A. For example, data 407 (e.g., raw burst data) arrives at data collection and analysis system 403 (e.g., system 500) and is aggregated into burst data 502. This aggregation can include discarding some parameters in data 407, but the aggregation does not exclude any burst, according to some embodiments.

According to some embodiments, cluster controller 501 is configured to receive burst data 502 associated with laser source 401. Cluster controller 501 is further configured to categorize (e.g., cluster) burst data 502 and generate burst data block(s) 504. According to some embodiments, cluster controller 501 is configured to categorize burst data 502 based on ECM value associated with burst data 502. The ECM value can indicate whether the one or more bursts of laser pulses corresponding to burst data 502 is generated for external use or internal use. Cluster controller 501 is configured to determine the ECM value of burst data 502, and use the ECM value to categorize burst data 502. For example, if the ECM value indicates that the one or more bursts of laser pulses corresponding to burst data 502 are for an internal use, cluster controller 501 can categorize (e.g. cluster) burst data 502 to internal category. If the ECM value indicates that the one or more bursts of laser pulses are for an external use, cluster controller 501 can categorize burst data 502 to external category.

For example, as consecutive bursts of laser pulses arrive with same ECM value, cluster controller 501 can categorize (e.g., cluster) and store them as a block until cluster controller 501 determines that the ECM value changes. Once cluster controller 501 determines that the ECM value has changed, the block of cluster is aggregated and stored as internal use or is sent to calibration filter 503 for calibration category test.

After categorizing based on ECM value, cluster controller 501 can output burst data block 504. According to some embodiments, burst data block 504 is a block of burst data associated with one or more bursts categorized in the internal use category or in the external use category. According to some embodiments, burst data block 504 is input to calibration filter 503. In some embodiments, if burst data block 504 is categorized in the internal use category, calibration filter 503 is configured to output data 506a to metric generator 505. Alternatively, if burst data block 504 is categorized in the internal use category, cluster controller 501 can directly sent burst data block 504 as data 506a to metric generator 505 (e.g., bypassing calibration filter 503). In other words, if cluster controller 501 categorizes burst data 502 in the internal use category, cluster controller 501 can bypass calibration filter 503 and can directly send burst data block 504 as data 506a to metric generator 505. According to some embodiments, metric generator 505 may generate one or more metrics for data 506a. In some examples, the one or more metrics can be stored in table 507a. In some examples, table 507a can be a database in a storage device. In some embodiments, if cluster controller 501 determines that burst data 502 is to be categorized in the internal use category, cluster controller 501 can directly send burst data block 504 to metric generator 505 (without going through calibration filter 503). Alternatively, cluster controller 501 can directly send burst data block 504 to a table (not shown—e.g., different than table 507a) (e.g., bypassing calibration filter 503 and metric generator 505).

However, if burst data block 504 is categorized in the external use category, calibration filter 503 is configured to further categorize burst data block 504. For example, calibration filter 503 can determine whether burst data block 504 indicates that the one or more bursts associated with burst data 502 are to be used for on-wafer operation and/or for one or more calibration operations. As discussed in more detail below, calibration filter 503 is configured to apply a calibration category test to burst data block 504 to determine whether the one or more bursts associated with burst data 502 are to be used for on-wafer operation and/or for one or more calibration operations.

If, using burst data block 504, calibration filter 503 determines that the one or more bursts of laser pulses (or a subset of the one or more bursts) are to be used for on-wafer operation, calibration filter 503 categorizes burst data block 504 (or a subset of burst data block 504) in on-wafer operation category and generates data 506b. Data 506b is sent to metric generator 505. Metric generator 505 can generate one or more metrics for data 506b and store them at, for example, table 507b. In some examples, table 507b can be a database in a storage device. In some embodiments, calibration filter 503 can directly send burst data block 504 (or a subset of burst data block 504) to a table (not shown—e.g., different than table 507b) (e.g., bypassing metric generator 505).

If, using burst data block 504, calibration filter 503 determines that the one or more bursts of laser pulses (or a subset of the one or more bursts) is to be used for one or more calibration operations, calibration filter 503 categorizes burst data block 504 (or a subset of burst data block 504) in calibration operation category and generates data 506c. In some embodiments, data 506c may be sent to metric generator 505. In these embodiments, metric generator 505 can generate one or more metrics for data 506c and store them at, for example, table 507c. In some examples, table 507c can be a database in a storage device. In some embodiments, calibration filter 503 can directly send burst data block 504 (or a subset of burst data block 504) to a table (not shown—e.g., different than table 507c) (e.g., bypassing metric generator 505).

As discussed above, in some embodiments, the calibration operation category can be further divided into two more sub-categories and calibration filter 503 can be configured to analyze and aggregate burst data block 504 (or a subset of burst data block 504) in two or more sub-categories. For example, each one of the two or more sub-categories in the calibration operation category can be associated with one calibration operation. According to some embodiments, calibration filter 503 can be configured to aggregate burst data block 504 in a sub-category associated with a corresponding calibration operation based on one or more parameters associated with that calibration operation. Using the one or more parameters associated with each calibration operation, calibration filter 503 can aggregate burst data block 504 into its associated calibration operation sub-category.

According to some embodiments, in order to categorize burst data block 504 into the on-wafer operation category and/or the calibration operation category, calibration filter 503 can start by examining the number of bursts of laser pulses associated with burst data block 504. In this example, if calibration filter 503 determines that burst data block 504 is associated with one burst, calibration filter 503 determines that this one burst is used for a calibration operation. Therefore, calibration filter 503 can categorize (e.g., cluster) the one burst into the calibration operation category.

However, if calibration filter 503 determines that burst data block 504 includes more than one burst (two or more bursts of laser pulses), then calibration filter 503 can perform the calibration category test. The exemplary calibration category test discussed below is discussed with respect to one calibration operation (e.g., a sinusoidal calibration operation.) However, the embodiments of this disclosure are not limited to this exemplary calibration category test. Other calibration category tests can be used for different calibration operations. In other words, calibration filter 503 can perform one or more calibration category tests for one or more calibration operations. In some examples, each one of the calibration category tests can be designed based on one or more parameters specific to the calibration operation.

According to some examples, to perform the calibration category test, calibration filter 503 can consider three parameters associated with each burst in burst data block 504. These parameters can include the number of pulses per burst (PPB), high voltage command variance (HVV), and inter-burst interval (IBI). However, in other embodiments, calibration filter 503 can consider less or more parameters or different parameters for the calibration category test.

For each burst, burst data block 504 can include a number of pulses in the burst (PPB). Calibration filter 503 is configured to determine the number of PPB for each of the bursts in burst data block 504. In some embodiments, laser source 401 uses a high voltage command to generate each laser pulse in a burst. A burst's HVV is the variance between high voltage commands for the lasers pulses in that burst. Also, according to some embodiments, IBI can be defined as a time period between two bursts in burst data block 504.

According to some embodiments, the calibration category test can be divided into two sections based on the number of burst in burst data block 504. For example, a number-of-bursts-threshold can be used to divide the calibration category test in two sections. If the number of bursts in burst data block 504 is less than or equal to the number-of-bursts-threshold, calibration filter 503 uses the number of PPB and HVV associated with the last burst of burst data block 504 to perform the calibration category test. If the number of bursts in burst data block 504 is more than the number-of-bursts-threshold, calibration filter 503 uses the number of PPB, the HVV, and the IBI associated with the last burst of burst data block 504 to perform the calibration category test. Some exemplary embodiments performing the methods of calibration category test are discussed below with respect of FIGS. 6, 7A, and 7B.

Figure 6:
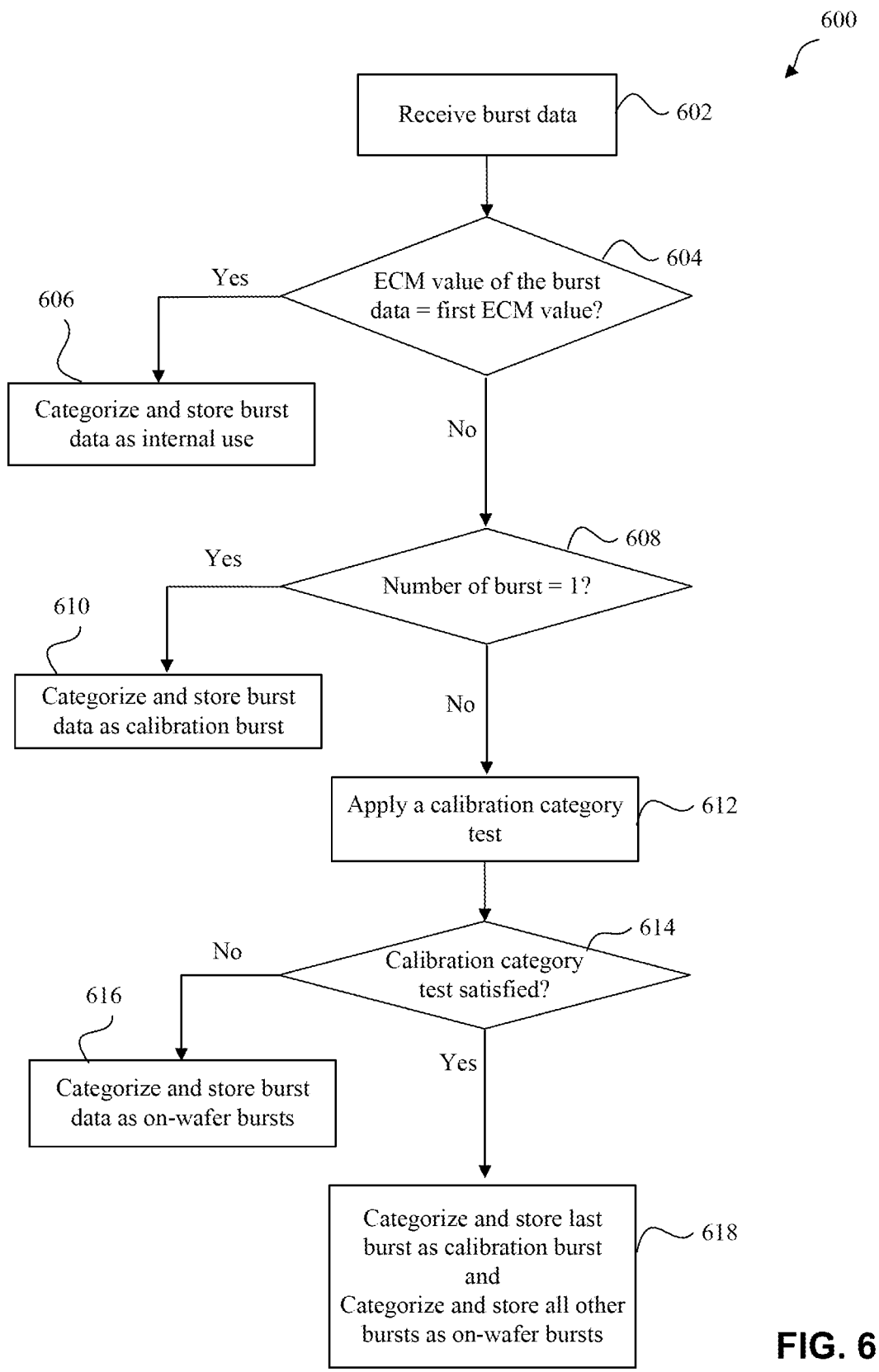
FIG. 6 illustrates an example method for determining and categorizing one or more bursts of laser pulses, according to some embodiments of the disclosure.

FIG. 6 illustrates an example method 600 for determining and categorizing one or more bursts of laser pulses, according to some embodiments of the disclosure. As a convenience and not a limitation, FIG. 6 may be described with regard to elements of FIGS. 1-5. Method 600 may represent the operation of data collection and analysis system 403 for determining and categorizing one or more bursts of laser pulses. Method 600 may be performed by data collection and analysis system 403 of FIG. 4A, cluster controller 501 and calibration filter 503, and/or computer system 800 of FIG. 8. But method 600 is not limited to the specific embodiments depicted in those figures and other systems may be used to perform the method as will be understood by those skilled in the art. It is to be appreciated that not all operations may be needed, and the operations may not be performed in the same order as shown in FIG. 6.

In 602, data associated with one or more bursts of laser pulses is received. For example, cluster controller 501 receives burst data 502. Burst data 502 can be based on raw burst data associated with one or more bursts from laser source 401.

In 604, an energy control mode (ECM) value associated with the one or more bursts are determined from the received burst data and the ECM value is compared to a first ECM value. According to some examples, the first ECM value can be associated with a burst used for internal use. For example, the first ECM value can be ECM1 421 of FIGS. 4B-4D.

If the determined ECM value associated with the one or more bursts is equal to the first ECM value, method 600 moves to 606. In 606, the one or more bursts are determined and are categorized as bursts for internal use. For example, cluster controller 501 can determine that the one or more bursts associated with the received burst data are for internal use. According to some embodiments, the received burst data can be categorized and stored at, for example, table 507a associated with internal use bursts. Additionally, or alternatively, the received burst data can be sent to metric generator 505 to generate one or more metrics based on the burst data. In this example, the generated one or more metrics can be stored in, for example, table 507a and/or be used for monitoring and/or controlling laser source 401.

If the determined ECM value associated with the one or more bursts is different than the first ECM value, method 600 moves to 608. In 608, the number of bursts associated with the received burst data is determined from the burst data and is compared to value 1. Additionally, or alternatively, in 608, the one or more bursts are determined and are categorized as bursts for external use. For example, cluster controller 501 can determine that the one or more bursts associated with the received burst data are for external use. According to some embodiments, the received burst data are sent to calibration filter 503 to further determine whether the one or more bursts associated with the received burst data are for on-wafer operation and/or are for one or more calibration operations.

As mentioned above, in 608, the number of bursts associated with the received burst data is determined from the burst data and is compared to value 1. If the one or more bursts include one burst, method 600 moves to 610, where the one burst associated with the received burst data is determined and is categorized as the calibration burst. For example, calibration filter 503 determines that the one burst is the calibration burst, categorizes the burst data in calibration operation category, and stores the burst data in, for example, table 507c. Additionally, or alternatively, the received burst data can be sent to metric generator 505 to generate one or more metrics based on the burst data. In this example, the generated one or more metrics can be stored in, for example, table 507c and/or be used for monitoring/controlling laser source 401 and/or monitoring/controlling the lithographic apparatus using the laser source 401.

If the one or more bursts include more than one burst (two or more bursts), method 600 moves to 612, where a calibration category test is performed on the received burst data. The application of the calibration category test is further discussed below with respect to FIGS. 7A and 7B.

In 614, it is determined whether the calibration category test is satisfied or not. For example, calibration filter 503 applies the calibration category test and, based on the result, categorizes the one or more bursts associated with the received burst data. If the calibration category test is not satisfied, method 600 moves to 616, where the one or more bursts are determined and are categorized as on-wafer bursts. For example, calibration filter 503 determines that the bursts are on-wafer bursts, categorizes the burst data in on-wafer operation category, and stores the burst data in, for example, table 507b. Additionally, or alternatively, the received burst data can be sent to metric generator 505 to generate one or more metrics based on the burst data. In this example, the generated one or more metrics can be stored in, for example, table 507b and/or be used for monitoring/controlling laser source 401 and/or monitoring/controlling the lithographic apparatus using the laser source 401.

If the calibration category test is satisfied, method 600 moves to 618. In 618, the last burst of the one or more bursts is determined and is categorized as a calibration burst. For example, calibration filter 503 determines that the last burst is calibration burst, categorizes the burst data associated with the last burst in calibration operation category, and stores the burst data associated with the last burst in, for example, table 507c. Additionally, or alternatively, the received burst data associated with the last burst can be sent to metric generator 505 to generate one or more metrics based on the burst data. In this example, the generated one or more metrics can be stored in, for example, table 507c and/or be used for monitoring/controlling laser source 401 and/or monitoring/controlling the lithographic apparatus using the laser source 401.

Additionally, in 618, the rest of the bursts (excluding the last burst) are determined and are categorized as on-wafer bursts. For example, calibration filter 503 determines that the rest of the bursts are on-wafer bursts, categorizes the burst data associated with the rest of the bursts in on-wafer operation category, and stores the burst data associated with the rest of the bursts in, for example, table 507b. Additionally, or alternatively, the received burst data associated with the rest of the bursts can be sent to metric generator 505 to generate one or more metrics based on the burst data. In this example, the generated one or more metrics can be stored in, for example, table 507b and/or be used for monitoring/controlling laser source 401 and/or monitoring/controlling the lithographic apparatus using the laser source 401.

Figure 7A:
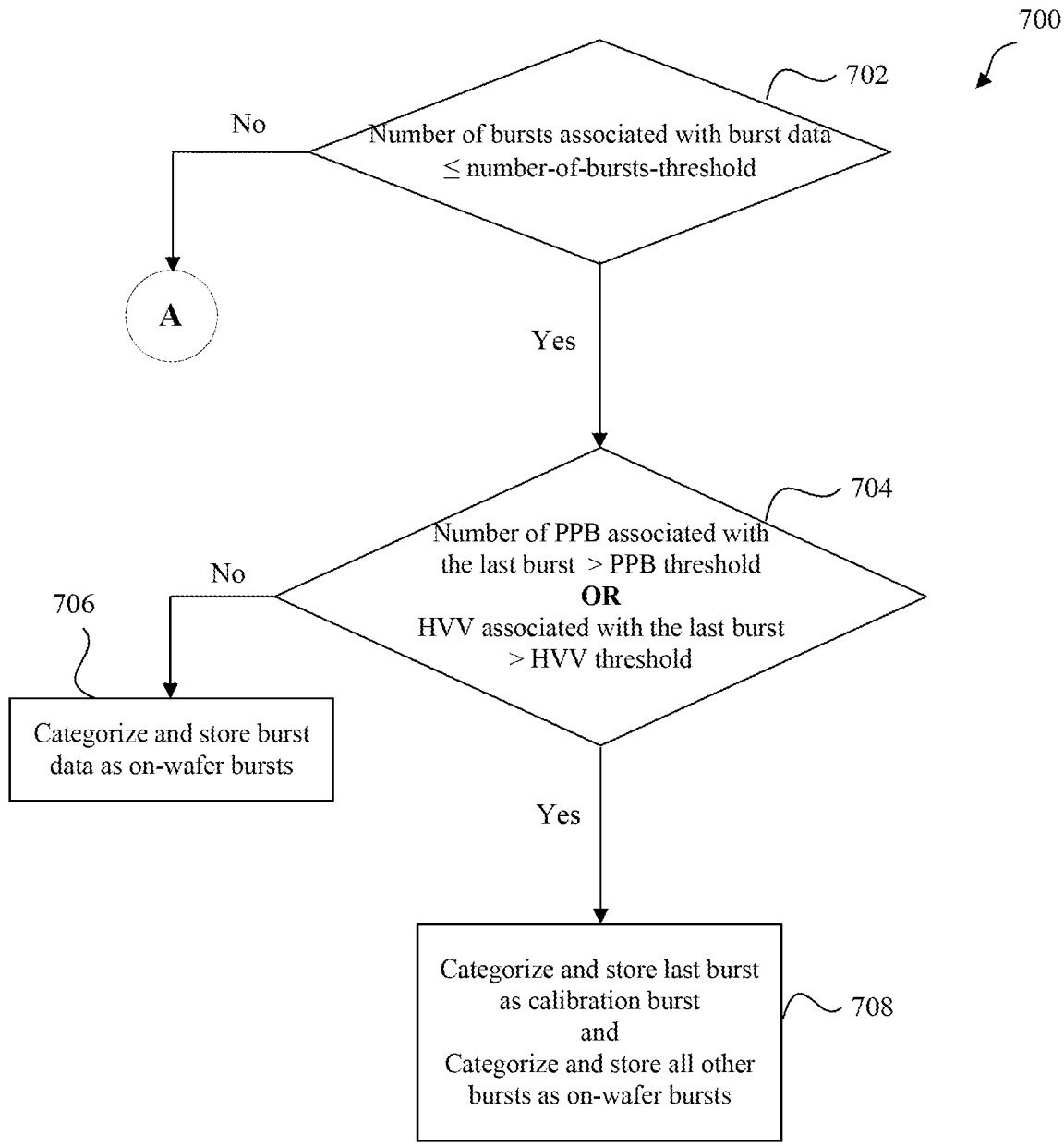
FIGS. 7A and 7B are flow charts that illustrate methods for determining and categorizing one or more bursts as on-wafer or calibration bursts, according to some embodiments of the disclosure.
Figure 7B:
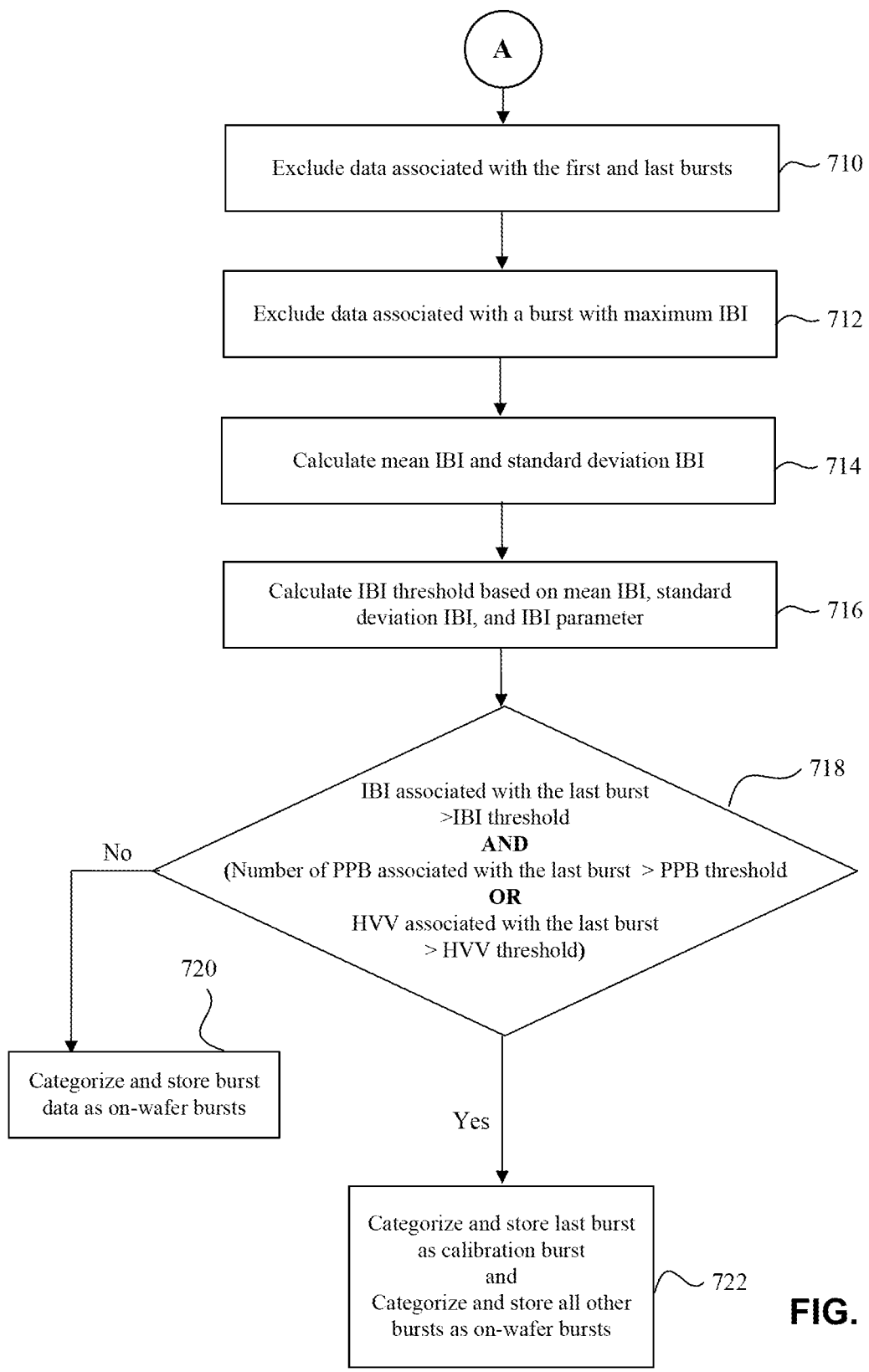

FIGS. 7A and 7B illustrate an example method 700 for determining and categorizing one or more bursts as on-wafer or calibration bursts, according to some embodiments of the disclosure. As a convenience and not a limitation, FIGS. 7A and 7B may be described with regard to elements of FIGS. 1-6. Method 700 may represent the operation of data collection and analysis system 403 for determining and categorizing one or more bursts as on-wafer or calibration bursts. Method 700 may be performed by data collection and analysis system 403 of FIG. 4A, calibration filter 503, and/or computer system 800 of FIG. 8. But method 700 is not limited to the specific embodiments depicted in those figures and other systems may be used to perform the method as will be understood by those skilled in the art. It is to be appreciated that not all operations may be needed, and the operations may not be performed in the same order as shown in FIGS. 7A and 7B.

According to some embodiments, method 700 can be part of (or include) steps 612, 614, 616, and 618 of method 600 of FIG. 6. In other words, the application of the calibration category test and the analysis of the results of the calibration category test can be performed by method 700, according to some embodiments.

In 702, the number of the bursts associated with the received burst data is determined from the burst data and is compared to a number-of-bursts-threshold. If the number of bursts associated with the burst data is less than or equal to the number-of-bursts-threshold (e.g., not enough bursts are available), method 700 moves to 704. In 704, two thresholds are used for determining and categorizing the bursts. For example, in 704, a number of pulses per burst (PPB) for the last burst in the one or more bursts associated with the burst data can be determined (from, for example, the received burst data). The number of PPB for the last burst can be compared to a PPB threshold. Additionally, or alternatively, a high voltage command variance (HVV) for the last burst in the one or more bursts associated with the burst data can be determined (from, for example, the received burst data). The HVV for the last burst can be compared to a HVV threshold.

If the number of PPB associated with the last burst is greater than PPB threshold OR the HVV associated with the last burst is greater than the HVV threshold, it is determined that the calibration category test is satisfied (Yes to 614 of FIG. 6). In this example, method 700 moves to 708, which is similar to 618 of FIG. 6.

Otherwise (e.g., if the number of PPB associated with the last burst is less than or equal to PPB threshold AND the HVV associated with the last burst is less than or equal to the HVV threshold), it is determined that the calibration category test is not satisfied (No to 614 of FIG. 6). In this example, method 700 moves to 706, which is similar to 616 of FIG. 6.

Going back to 702, if the number of bursts associated with the burst data is more than the number-of-bursts-threshold (e.g., enough bursts are available), method 700 moves to 710 as illustrated in FIG. 7B. In 710, data from burst data associated with the first and last bursts are excluded from the burst data. For example, calibration filter 503 excludes the data from burst data associated with the first and last bursts to generate a first modified burst data.

In 712, data associated with a burst having the maximum interburst interval is excluded from the first modified burst data. For example, calibration filter 503 excludes the data associated with a burst having the maximum interburst interval (IBI) to generate a second modified burst data. To do so, calibration filter 503 can determine and analyze, from the first modified burst data, the IBI for each burst, according to some embodiments. Using this analysis, calibration filter 503 can determine the burst with the maximum IBI.

In 714, a mean IBI value is calculated using the IBI values in the second modified burst data. Additionally, or alternatively, a standard deviation value for IBI is calculated based on the IBI values in the second modified data. For example, calibration filter 503 can calculate and generate the mean IBI value and the standard deviation IBI value.

In 716, an IBI threshold is determined based on the mean IBI value, the standard deviation IBI value, and an IBI parameter. Equation below represents one exemplary IBI threshold:

$$\text{IBI threshold} = \text{mean IBI value} + (C \cdot \text{standard deviation IBI value}).$$

Here, C is the IBI parameter. In some examples, C can be a configurable parameter.

In this example, the IBI threshold is determined based on the second modified data (which is based on the received burst data). In other words, the IBI threshold is determined dynamically and based on the received burst data. However, the embodiments of this disclosure are not limited to this example and other formulas can be used to determine the IBI threshold. Alternatively, the IBI threshold can be a fixed threshold provided to calibration filter 503.

In 718, three thresholds are used for determining and categorizing the bursts. For example, in 718, the IBI associated with the last burst in the one or more bursts associated with the burst data can be determined (from, for example, the received burst data). The IBI for the last burst can be compared to the IBI threshold calculated in 716. Additionally, the number of pulses per burst (PPB) for the last burst in the one or more bursts associated with the burst data can be determined (from, for example, the received burst data). The number of PPB for the last burst can be compared to a PPB threshold. Additionally, or alternatively, a high voltage command variance (HVV) for the last burst in the one or more bursts associated with the burst data can be determined (from, for example, the received burst data). The HVV for the last burst can be compared to a HVV threshold.

If the IBI associated with the last burst is greater than the IBI threshold AND, the number of PPB associated with the last burst is greater than PPB threshold OR the HVV associated with the last burst is greater than the HVV threshold, it is determined that the calibration category test is satisfied (Yes to 614 of FIG. 6). In this example, method 700 moves to 722, which is similar to 618 of FIG. 6.

Otherwise (e.g., if the IBI associated with the last burst is less than or equal to the IBI threshold OR, the number of PPB associated with the last burst is less than or equal to PPB threshold AND the HVV associated with the last burst is less than or equal to the HVV threshold), it is determined that the calibration category test is not satisfied (No to 614 of FIG. 6). In this example, method 700 moves to 720, which is similar to 616 of FIG. 6.

Methods 600 and 700 are discussed above with respect to using IBI, PPB, and HVV parameters to determine (and categorize) whether a burst is a calibration burst or not. However, the methods and systems of this disclosure are not limited to these parameters. The embodiments of this disclosure can be applied to distinguishing on-wafer bursts from calibration bursts for one or more different calibration operations. For each calibration operation, one or more parameters (e.g., characteristics) of the calibration burst that differentiate the calibration burst from the on-wafer bursts can be used in distinguishing and categorizing the bursts.

For example, the one or more bursts of laser pulses can include a first calibration burst used for a first calibration operation, a second calibration burst used for a second calibration operation, and one or more on-wafer bursts used for the on-wafer operation. In this example, the first calibration burst can include a first characteristic that differentiates the first calibration burst from the on-wafer bursts. Also, the second calibration burst can include a second characteristic that differentiates the second calibration burst from the on-wafer bursts. In this example, data collection and analysis system 403 can use the first characteristic of the first calibration burst and the second characteristic of the second calibration burst to distinguish the first and second calibration bursts from the on-wafer bursts. Additionally, or alternatively, data collection and analysis system 403 can use the first characteristic of the first calibration burst and the second characteristic of the second calibration burst to distinguish the first and second calibration bursts from each other.

According to some embodiments, when a calibration burst is identified by, for example, data collection and analysis system 403, the calibration burst can be paired with its corresponding wafer. In some examples, this pairing can be done by data collection and analysis system 403. For example, the pairing can be performed by calibration filter 503 and the pairing can be stored in, for example, table 507c.

According to some examples, for each calibration burst identified by, for example, data collection and analysis system 403, a wafer identifier (ID) of a subsequent wafer (in time) is assigned (by, for example, data collection and analysis system 403) to the identified calibration burst. If two or more consecutive calibration bursts are identified, without a wafer (a group of bursts associated with a wafer) between them, a wafer ID is assigned to the last calibration burst. In this example, the preceding calibration burst(s) are stored with a null wafer ID. In some examples, if a time between the identified calibration burst and using the subsequent wafer is greater than a threshold, then the wafer ID is not assigned to the identified calibration burst.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

Figure 8:
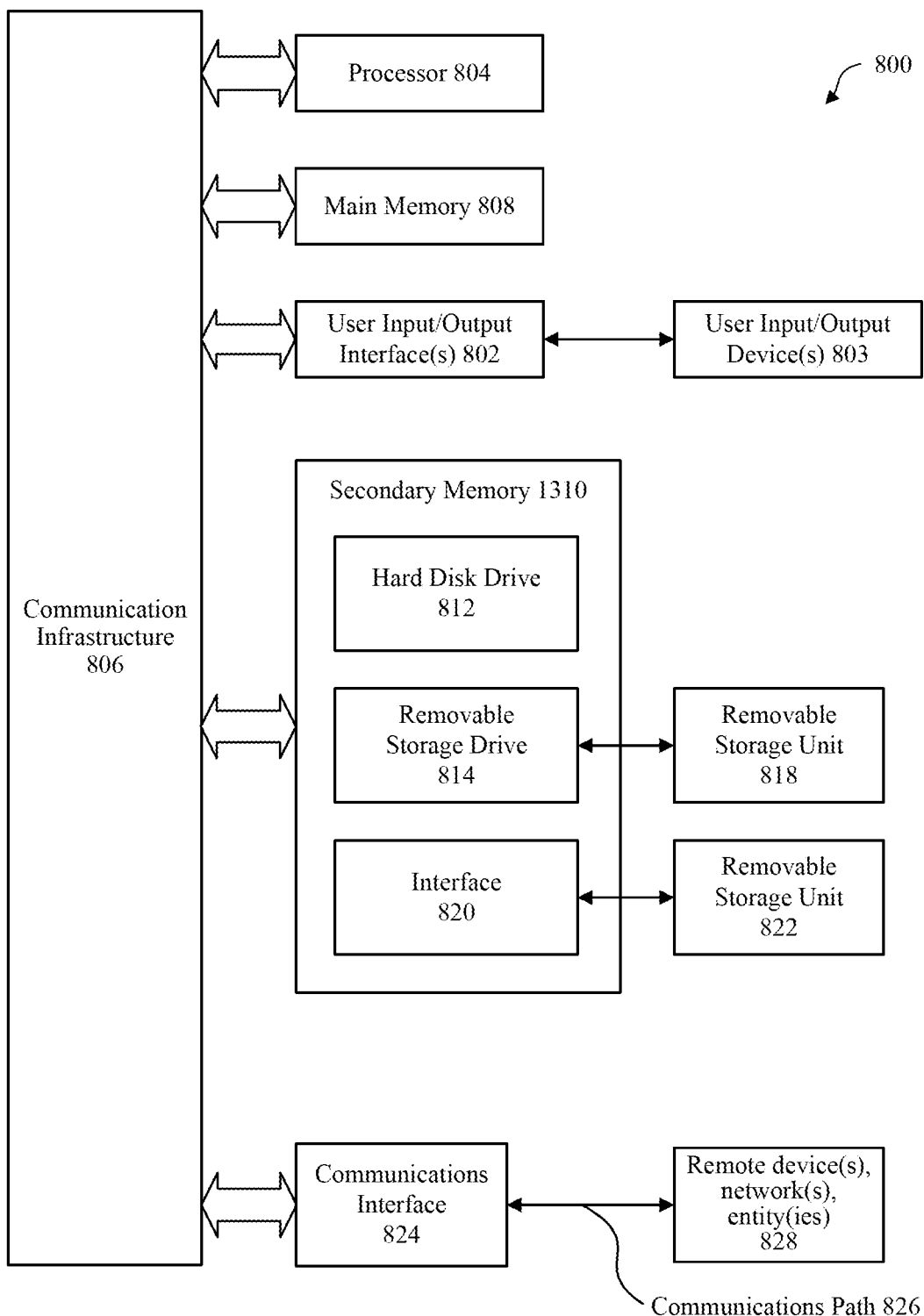
FIG. 8 is an example computer system for implementing some embodiments of the disclosure, or portion(s) thereof.

Various embodiments can be implemented, for example, using one or more computer systems, such as computer system 800 shown in FIG. 8. Computer system 800 can be any well-known computer capable of performing the functions described herein such as functions performed by data collection and analysis system 403 of FIG. 4A, cluster controller 501 of FIG. 5, calibration filter 503 of FIG. 5, and/or metric generator 505 of FIG. 5. Computer system 800 includes one or more processors (also called central processing units, or CPUs), such as a processor 804. Processor 804 is connected to a communication infrastructure 806 (e.g., a bus.) Computer system 800 also includes user input/output device(s) 803, such as monitors, keyboards, pointing devices, etc., that communicate with communication infrastructure 806 through user input/output interface(s) 802. Computer system 800 also includes a main or primary memory 808, such as random access memory (RAM). Main memory 808 may include one or more levels of cache. Main memory 808 has stored therein control logic (e.g., computer software) and/or data.

Computer system 800 may also include one or more secondary storage devices or memory 810. Secondary memory 810 may include, for example, a hard disk drive 812 and/or a removable storage device or drive 814. Removable storage drive 814 may be a floppy disk drive, a magnetic tape drive, a compact disk drive, an optical storage device, tape backup device, and/or any other storage device/drive.

Removable storage drive 814 may interact with a removable storage unit 818. Removable storage unit 818 includes a computer usable or readable storage device having stored thereon computer software (control logic) and/or data. Removable storage unit 818 may be a floppy disk, magnetic tape, compact disk, DVD, optical storage disk, and/any other computer data storage device. Removable storage drive 814 reads from and/or writes to removable storage unit 818 in a well-known manner.

According to some embodiments, secondary memory 810 may include other means, instrumentalities or other approaches for allowing computer programs and/or other instructions and/or data to be accessed by computer system 800. Such means, instrumentalities or other approaches may include, for example, a removable storage unit 822 and an interface 820. Examples of the removable storage unit 822 and the interface 820 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 800 may further include a communication or network interface 824. Communication interface 824 enables computer system 800 to communicate and interact with any combination of remote devices, remote networks, remote entities, etc. (individually and collectively referenced by reference number 828). For example, communication interface 824 may allow computer system 800 to communicate with remote devices 828 over communications path 826, which may be wired and/or wireless, and which may include any combination of LANs, WANs, the Internet, etc. Control logic and/or data may be transmitted to and from computer system 800 via communication path 826.

The operations in the preceding embodiments can be implemented in a wide variety of configurations and architectures. Therefore, some or all of the operations in the preceding embodiments may be performed in hardware, in software or both. In some embodiments, a tangible, non-transitory apparatus or article of manufacture includes a tangible, non-transitory computer useable or readable medium having control logic (software) stored thereon is also referred to herein as a computer program product or program storage device. This includes, but is not limited to, computer system 800, main memory 808, secondary memory 810 and removable storage units 818 and 822, as well as tangible articles of manufacture embodying any combination of the foregoing. Such control logic, when executed by one or more data processing devices (such as computer system 800), causes such data processing devices to operate as described herein.

Based on the teachings contained in this disclosure, it will be apparent to persons skilled in the relevant art(s) how to make and use embodiments of the disclosure using data processing devices, computer systems and/or computer architectures other than that shown in FIG. 8. In particular, embodiments may operate with software, hardware, and/or operating system implementations other than those described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the embodiments in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that the embodiments may be practiced otherwise than as described. The description is not intended to limit the embodiments.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the present embodiments and the appended claims in any way.

Some embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

Other aspects of the invention are set out in the following numbered clauses.

1. A laser analysis system, comprising:
   a laser source configured to generate one or more bursts of laser pulses; and
   a data collection and analysis system configured to:
   receive, from the laser source, data associated with the one or more bursts of laser pulses;
   determine, based on the received data, that the one or more bursts of laser pulses are for external use; and
   determine, based on the received data, whether the one or more bursts of laser pulses are for an on-wafer operation or are for a calibration operation.

2. The laser analysis system of clause 1, wherein to determine that the one or more bursts of laser pulses are for external use, the data collection and analysis system is configured to:
   determine, from the received data, an energy control mode (ECM) value associated with the one or more bursts of laser pulses;
   compare the determined ECM value with a first ECM value; and
   in response to the determined ECM value being different from the first ECM value, determine that the one or more bursts of laser pulses are for external use.

3. The laser analysis system of clause 1, wherein the data collection and analysis system is further configured to:
   determine a number of bursts in the one or more bursts of laser pulses; and
   in response to determining that the one or more bursts of laser pulses comprises one burst, determine that the one burst of laser pulses is for the calibration operation.

4. The laser analysis system of clause 3, wherein the data collection and analysis system is further configured to:
   in response to determining that the one or more bursts of laser pulses comprise more than one burst, apply a calibration category test to the received data.

5. The laser analysis system of clause 4, wherein the data collection and analysis system is further configured to:
   in response to the calibration category test being satisfied:
   determine that a last burst of the one or more bursts is for the calibration operation; and
   determine that other bursts in the one or more bursts are for the on-wafer operation.

6. The laser analysis system of clause 4, wherein the data collection and analysis system is further configured to:
   in response to the calibration category test not being satisfied, determine that the one or more bursts are for the on-wafer operation.

7. The laser analysis system of clause 4, wherein the data collection and analysis system is further configured to:
   exclude, from the received data, data associated with a first burst and a last burst of the one or more bursts to generate a first modified data;
   exclude, from the first modified data, data associated with a burst with maximum inter burst interval (IBI) value to generate a second modified data;
   generate a mean IBI value based on IBI values in the second modified data;
   generate a standard deviation value based on the IBI values in the second modified data; and
   generate an IBI threshold based on the mean IBI value, the standard deviation value, and an IBI parameter.

8. The laser analysis system of clause 7, wherein the data collection and analysis system is further configured to:
   in response to an IBI value associated with the last burst being greater than the IBI threshold and, a pulse per burst (PPB) associated with the last burst being greater than a PBB threshold or a high voltage command variance (HVV) associated with the last burst being greater than a HVV threshold, determine that the calibration category test is satisfied; and in response to the determining that the calibration category test is satisfied:
determine that the last burst of the one or more bursts is for the calibration operation; and
determine that other bursts in the one or more bursts are for the on-wafer operation 9. The laser analysis system of clause 1, wherein the data collection and analysis system is further configured to:
determine that a first part of the one or more bursts are for the calibration operation;
determine that a second part of the one or more bursts are for the on-wafer operation; and
use data, from the received data, associated with the second part of the one or more bursts to determine one or more metrics for the second part of the one or more bursts.

10. The laser analysis system of clause 1, wherein:
the one or more bursts comprises a calibration burst used for the calibration operation and one or more on-wafer bursts used for the on-wafer operation,
the calibration burst comprises a characteristic that differentiates the calibration burst from the one or more on-wafer bursts, and
the data collection and analysis system is configured to use the characteristic of the calibration burst to distinguish the calibration burst from the one or more on-wafer bursts.

11. The laser analysis system of clause 10, where the data collection and analysis system is further configured to assign a wafer identifier to the calibration burst.

12. The laser analysis system of clause 1, wherein:
the one or more bursts comprises a first calibration burst used for the calibration operation, a second calibration burst used for a second calibration operation, and one or more on-wafer bursts used for the on-wafer operation,
the first calibration burst comprises a first characteristic that differentiates the first calibration burst from the one or more on-wafer bursts,
the second calibration burst comprises a second characteristic that differentiates the second calibration burst from the one or more on-wafer bursts,
the data collection and analysis system is configured to use the first characteristic of the first calibration burst and the second characteristic of the second calibration burst to distinguish the first and second calibration bursts from the one or more on-wafer bursts.

13. A method for analyzing data associated with a laser source, the method comprising:
receiving, at a data collection and analysis system and from a laser source, data associated with one or more bursts of laser pulses generated by the laser source;
determining, by the data collection and analysis system and based on the received data, that the one or more bursts of laser pulses are for external use; and
determining, by the data collection and analysis system based on the received data, whether the one or more bursts of laser pulses are for an on-wafer operation or are for a calibration operation.

14. The method of clause 13, further comprising:
determining, by the data collection and analysis system, that a first part of the one or more bursts are for the calibration operation;
determining, by the data collection and analysis system, that a second part of the one or more bursts are for the on-wafer operation; and
using, by the data collection and analysis system, data associated with the second part of the one or more bursts to determine one or more metrics for the second part of the one or more bursts.

15. The method of clause 13, wherein:
the one or more bursts comprises a calibration burst used for the calibration operation and one or more on-wafer bursts used for the on-wafer operation,
the calibration burst comprises a characteristic that differentiates the calibration burst from the one or more on-wafer bursts, and
the method further comprising:
using the characteristic of the calibration burst to distinguish the calibration burst from the one or more on-wafer bursts.

16. The method of clause 13, wherein:
the one or more bursts comprises a first calibration burst used for the calibration operation, a second calibration burst used for a second calibration operation, and one or more on-wafer bursts used for the on-wafer operation,
the first calibration burst comprises a first characteristic that differentiates the first calibration burst from the one or more on-wafer bursts,
the second calibration burst comprises a second characteristic that differentiates the second calibration burst from the one or more on-wafer bursts,
the method further comprising:
using the first characteristic of the first calibration burst and the second characteristic of the second calibration burst to distinguish the first and second calibration bursts from the one or more on-wafer bursts.

17. The method of clause 13, wherein the determining that the one or more bursts of laser pulses are for external use comprises:
determining, from the received data, an energy control mode (ECM) value associated with the one or more bursts of laser pulses;
comparing the determined ECM value with a first ECM value; and
in response to the determine ECM value being different from the first ECM value, determining that the one or more bursts of laser pulses are for external use.

18. The method of clause 13, further comprising:
determining a number of bursts in the one or more bursts of laser pulses;
in response to determining that the one or more bursts of laser pulses comprises one burst, determining that the one burst of laser pulses is for the calibration operation; and
in response to determining that the one or more bursts of laser pulses comprise more than one burst, applying a calibration category test to the received data.

19. The method of clause 13, further comprising:
in response to the calibration category test being satisfied:
determining that a last burst of the one or more bursts is for the calibration operation; and
determining that other bursts in the one or more bursts are for the on-wafer operation; and
in response to the calibration category test not being satisfied, determining that the one or more bursts are for the on-wafer operation.

20. The method of clause 19, further comprising:
excluding, from the received data, data associated with a first burst and a last burst of the one or more bursts to generate a first modified data;
excluding, from the first modified data, data associated with a burst with maximum inter burst interval (IBI) value to generate a second modified data;
generating a mean IBI value based on IBI values in the second modified data;
generating a standard deviation value based on the IBI values in the second modified data;
generating an IBI threshold based on the mean IBI value, the standard deviation value, and an IBI parameter; and
in response to an IBI value associated with the last burst being greater than the IBI threshold and, a pulse per burst (PPB) associated with the last burst being greater than a PBB threshold or a high voltage command variance (HVV) associated with the last burst being greater than a HVV threshold, determining that the calibration category test is satisfied.

21. A lithographic apparatus, comprising:
an illumination system configured to condition a radiation beam;
a projection system configured to project a pattern imparted to the radiation beam onto a substrate,
wherein the illumination system comprises:
a laser source configured to generate one or more bursts of laser pulses; and
a data collection and analysis system configured to:
receive, from the laser source, data associated with the one or more bursts of laser pulses;
determine, based on the received data, that the one or more bursts of laser pulses are for external use; and
determine, based on the received data, whether the one or more bursts of laser pulses are for an on-wafer operation or are for a calibration operation.

22. A non-transitory computer-readable medium storing instructions that, when executed by a processor, cause the processor to perform operations, the operations comprising:
receiving, from a laser source, data associated with one or more bursts of laser pulses generated by the laser source;
determining, based on the received data, that the one or more bursts of laser pulses are for external use; and
determining, based on the received data, whether the one or more bursts of laser pulses are for an on-wafer operation or are for a calibration operation.

The breadth and scope of the present disclosure should not be limited by any of the above-described exemplary embodiments, but should be defined only in accordance with the following claims and their equivalents.

What is claimed is:
1. A laser analysis system, comprising:
a laser source configured to generate bursts of laser pulses; and
a data collection and analysis system configured to:
receive, from the laser source, respective data associated with the bursts of laser pulses;
categorize, based on the received respective data, some of the bursts of laser pulses and/or the respective data associated therewith into an internal use category of pulses used within the laser source and some of the bursts of laser pulses and/or the respective data associated therewith into an external use category of pulses used outside the laser source; and
categorize, based on the received respective data, some of the bursts of laser pulses and/or the respective data associated therewith in the external use category into an on-wafer operation category and some of the bursts of laser pulses and/or the respective data associated therewith in the external use category into a calibration operation category.

2. The laser analysis system of claim 1, wherein to categorize some of the bursts of laser pulses and/or the respective data associated therewith into the external use category, the data collection and analysis system is configured to:
determine, from the received respective data, respective energy control mode (ECM) values associated with the bursts of laser pulses;
compare the determined respective ECM values with a first ECM value; and
in response to the determined respective ECM values being different from the first ECM value, categorize bursts of laser pulses and/or the respective data associated therewith into the external use category.

3. The laser analysis system of claim 2, wherein the data collection and analysis system is further configured to:
group the respective data associated with the bursts of laser pulses into burst data blocks of consecutive bursts having the same ECM value;
for burst data blocks of bursts of laser pulses in the external use category, determine a number of bursts of laser pulses in the burst data blocks; and
in response to determining that a number of bursts of laser pulses in a burst data block is one burst of laser pulses, categorize the one burst of laser pulses and/or the respective data associated therewith into the calibration operation category.

4. The laser analysis system of claim 3, wherein the data collection and analysis system is further configured to:
in response to determining that the bursts of laser pulses of the burst data block comprise more than one burst, apply a calibration category test to the received respective data in the burst data block.

5. The laser analysis system of claim 4, wherein the data collection and analysis system is further configured to:
in response to the calibration category test being satisfied:
categorize a last burst of the bursts of the burst data block into the calibration operation category; and
categorize other bursts of the bursts of the burst data block into the on-wafer operation category.

6. The laser analysis system of claim 4, wherein the data collection and analysis system is further configured to:
in response to the calibration category test not being satisfied, categorize the bursts of the burst data block into the on-wafer operation category.

7. The laser analysis system of claim 4, wherein the data collection and analysis system is further configured to:
exclude data associated with a first burst and a last burst of the burst data block to generate a first modified data of the burst data block;
exclude, from the first modified data, data associated with a burst with maximum inter burst interval (IBI) value of bursts within the burst data block to generate a second modified data of the burst data block;
generate a mean IBI value based on IBI values in the second modified data;
generate a standard deviation value based on the IBI values in the second modified data; and
generate an IBI threshold based on the mean IBI value, the standard deviation value, and an IBI parameter.

8. The laser analysis system of claim 7, wherein the data collection and analysis system is further configured to:
in response to an IBI value associated with the last burst of the burst data block being greater than the IBI threshold, and a pulse per burst (PPB) associated with the last burst being greater than a PPB threshold or a high voltage command variance (HVV) associated with the last burst being greater than a HVV threshold, determine that the calibration category test is satisfied; and
in response to the determining that the calibration category test is satisfied:
categorize the last burst of the burst data block into the calibration operation category; and
categorize other bursts of the burst data block into the on-wafer operation category.

9. The laser analysis system of claim 1, wherein the data collection and analysis system is further configured to:
categorize a first part of the bursts into the calibration operation category;
categorize a second part of the bursts into the on-wafer operation category; and
use data, from the received respective data, associated with the second part of the bursts to determine one or more metrics for the second part of the bursts.

10. The laser analysis system of claim 1, wherein:
the bursts comprise a calibration burst used for a calibration operation and one or more-on-wafer bursts used for an on-wafer operation,
the calibration burst and/or the respective data associated therewith comprises a characteristic that differentiates the calibration burst and/or the respective data associated therewith from the one or more on-wafer bursts and/or the respective data associated therewith, and
the data collection and analysis system is configured to use the characteristic of the calibration burst and/or the respective data associated therewith to distinguish the calibration burst and/or the respective data associated therewith from the one or more on-wafer bursts and/or the respective data associated therewith.

11. The laser analysis system of claim 10, where the data collection and analysis system is further configured to assign a wafer identifier to the calibration burst and/or the respective data associated therewith.

12. The laser analysis system of claim 1, wherein:
the bursts comprise a first calibration burst used for a calibration operation, a second calibration burst used for a second calibration operation, and one or more on-wafer bursts used for an on-wafer operation,
the first calibration burst and/or the respective data associated therewith comprises a first characteristic that differentiates the first calibration burst and/or the respective data associated therewith from the one or more on-wafer bursts and/or the respective data associated therewith,
the second calibration burst and/or the respective data associated therewith comprises a second characteristic that differentiates the second calibration burst and/or the respective data associated therewith from the one or more on-wafer bursts and/or the respective data associated therewith,
the data collection and analysis system is configured to use the first characteristic of the first calibration burst and/or the respective data associated therewith and the second characteristic of the second calibration burst and/or the respective data associated therewith to distinguish the first and second calibration bursts and/or the respective data associated therewith from the one or more on-wafer bursts and/or the respective data associated therewith.

13. The laser analysis system of claim 1, wherein the data collection and analysis system is further configured to generate metrics for the bursts and/or the respective data associated therewith in the external use category based on the wafer operation category or the calibration operation category.

14. The laser analysis system of claim 1, wherein the data collection and analysis system is configured to categorize, based on the received respective data, some of the bursts of laser pulses and/or the respective data associated therewith into the external use category based on an energy control mode (ECM).

15. A method for analyzing data associated with a laser source, the method comprising:
receiving, at a data collection and analysis system and from a laser source, respective data associated with bursts of laser pulses generated by the laser source;
categorizing, by the data collection and analysis system and based on the received respective data, some of the bursts of laser pulses and/or the respective data associated therewith into an internal use category of pulses used within the laser source and some of the bursts of laser pulses and/or the respective data associated therewith into an external use category of pulses used outside the laser source; and
categorizing, by the data collection and analysis system based on the received respective data, some bursts of laser pulses in the external use category and/or the respective data associated therewith into an on-wafer operation category and some bursts of laser pulses in the external use category and/or the respective data associated therewith into a calibration operation category.

16. The method of claim 15, further comprising:
categorizing, by the data collection and analysis system, a first part of the bursts into the calibration operation category;
categorizing, by the data collection and analysis system, a second part of the bursts into the on-wafer operation category; and
using, by the data collection and analysis system, data associated with the second part of the bursts to determine one or more metrics for the second part of the bursts.

17. The method of claim 15, wherein:
the bursts comprise a calibration burst used for a calibration operation and one or more on-wafer bursts used for an on-wafer operation,
the calibration burst comprises a characteristic that differentiates the calibration burst from the one or more on-wafer bursts, and
the method further comprising:
using the characteristic of the calibration burst to distinguish the calibration burst from the one or more on-wafer bursts.

18. The method of claim 15, wherein:
the bursts comprises a first calibration burst used for a calibration operation, a second calibration burst used for a second calibration operation, and on-wafer bursts used for an on-wafer operation,
the first calibration burst comprises a first characteristic that differentiates the first calibration burst from the one or more on-wafer bursts, the second calibration burst comprises a second characteristic that differentiates the second calibration burst from the one or more on-wafer bursts, the method further comprising:

using the first characteristic of the first calibration burst and the second characteristic of the second calibration burst to distinguish the first and second calibration bursts from the one or more on-wafer bursts.

19. The method of claim 15, wherein the categorizing the bursts of laser pulses into the external use category comprises:

a method for analyzing data associated with a laser source comprising receiving, at a data collection and analysis system and from a laser source, respective data associated with bursts of laser pulses generated by the laser source; categorizing, by the data collection and analysis system and based on the received respective data, some of the bursts of laser pulses into the external use category; categorizing, by the data collection and analysis system based on the received respective data, some of the bursts of laser pulses in the external use category into the on-wafer operation category and some of the bursts of laser pulses in the external use category into a calibration operation category.

20. The method of claim 15, further comprising:

grouping the respective data associated with bursts of laser pulses into burst data blocks of consecutive bursts having the same ECM value;

determining a number of bursts in the burst data blocks;

in response to determining that a number of bursts of laser pulses in a burst data block is one, categorizing the burst into the calibration operation category; and in response to determining that the number of bursts of laser pulses in a burst data block comprises more than one burst, applying a calibration category test to the received data.

21. The method of claim 15, further comprising:

grouping the respective data associated with bursts of laser pulses into burst data blocks of consecutive bursts having the same ECM value; and in response to the calibration category test being satisfied:

categorizing a last burst of a burst data block into the calibration operation category; and categorizing other bursts of the burst data block into the on-wafer operation category; and in response to the calibration category test not being satisfied, categorizing the bursts of the bust data block into the on-wafer operation category.

22. The method of claim 21, further comprising:

excluding, from the received data, data associated with a first burst and a last burst of the burst data block to generate a first modified data of the burst data block;

excluding, from the first modified data, data associated with a burst with maximum inter burst interval (MI) value to generate a second modified data;

generating a mean IBI value based on IBI values in the second modified data;

generating a standard deviation value based on the IBI values in the second modified data;

generating an IBI threshold based on the mean IBI value, the standard deviation value, and an IBI parameter; and in response to an IBI value associated with the last burst of the burst data block being greater than the IBI threshold, and a pulse per burst (PPB) associated with the last burst being greater than a PPB threshold or a high voltage command variance (HVV) associated with the last burst being greater than a HVV threshold, determining that the calibration category test is satisfied for the burst data block.

23. A lithographic apparatus, comprising:

an illumination system configured to condition a radiation beam;

a projection system configured to project a pattern imparted to the radiation beam onto a substrate, wherein the illumination system comprises:

a laser source configured to generate bursts of laser pulses; and a data collection and analysis system configured to:

receive, from the laser source, respective data associated with the bursts of laser pulses; and categorize, based on the received respective data, some of the bursts of laser pulses and/or associated respective data into an internal use category for use within the laser source, some of the bursts of laser pulses and/or associated respective data into an on wafer operation category, and some of the bursts of laser pulses and/or associated respective data into a calibration operation category.

24. A non-transitory computer-readable medium storing instructions that, when executed by a processor, cause the processor to perform operations, the operations comprising:

receiving, from a laser source, respective data associated with bursts of laser pulses generated by the laser source; and categorizing, based on the received respective data, some of the bursts of laser pulses and/or associated respective data into an internal use category for use within the laser source, some of the one or more bursts of laser pulses and/or associated respective data into an on wafer operation category, and some of the bursts of laser pulses and/or associated respective data into a calibration operation category.

25. The non-transitory computer-readable medium of claim 24, wherein the operations further comprise comparing a determined energy control mode (ECM) value determined from the received respective data with a first ECM value, and categorizing some of the bursts of laser pulses into an internal use category for use within the laser source based on the comparison.

* * * * *